(12) United States Patent (10) Patent No.: US 7,892,976 B2
Motoyama (45) Date of Patent: Feb. 22, 2011

(54) SEMICONDUCTOR DEVICE AND METHOD FOR MANUFACTURING THE SAME

(75) Inventor: Koichi Motoyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/479,177

(22) Filed: Jun. 5, 2009

(65) Prior Publication Data

US 2009/0239377 A1 Sep. 24, 2009

Related U.S. Application Data

(62) Division of application No. 11/071,478, filed on Mar. 4, 2005, now Pat. No. 7,566,975.

(30) Foreign Application Priority Data

Mar. 4, 2004 (JP) .............................. 2004-060584

(51) Int. Cl.
*H01L 21/44* (2006.01)

(52) U.S. Cl. .............................. 438/687; 257/E21.144; 257/E21.153; 257/E21.579; 438/637; 438/653

(58) Field of Classification Search .......... 257/E21.144, 257/E21.153, E21.579; 438/637, 653, 687
See application file for complete search history.

(56) References Cited

U.S. PATENT DOCUMENTS

| 6,249,055 | B1 * | 6/2001 | Dubin ........................ 257/758 |
| 6,706,629 | B1 * | 3/2004 | Lin et al. .................... 438/687 |
| 2003/0186543 | A1 | 10/2003 | Jiang et al. |
| 2004/0004289 | A1 | 1/2004 | Ueno |

FOREIGN PATENT DOCUMENTS

| JP | 10-284603 | 10/1998 |
| JP | 2001-284449 | 10/2001 |

* cited by examiner

*Primary Examiner*—Asok K Sarkar
(74) *Attorney, Agent, or Firm*—Young & Thompson

(57) ABSTRACT

A semiconductor device includes a semiconductor substrate, a copper-containing metal interconnect over the semiconductor substrate, and a copper-containing connection plug, and the metal interconnect includes metal elements other than copper, and a concentration of different metal elements in a connection portion between the metal interconnect and the connection plug is higher than a concentration of the different metal elements in a center portion of the metal interconnect, and higher than a concentration of different elements in upper face portion of the metal interconnect other than the connection portion.

6 Claims, 18 Drawing Sheets

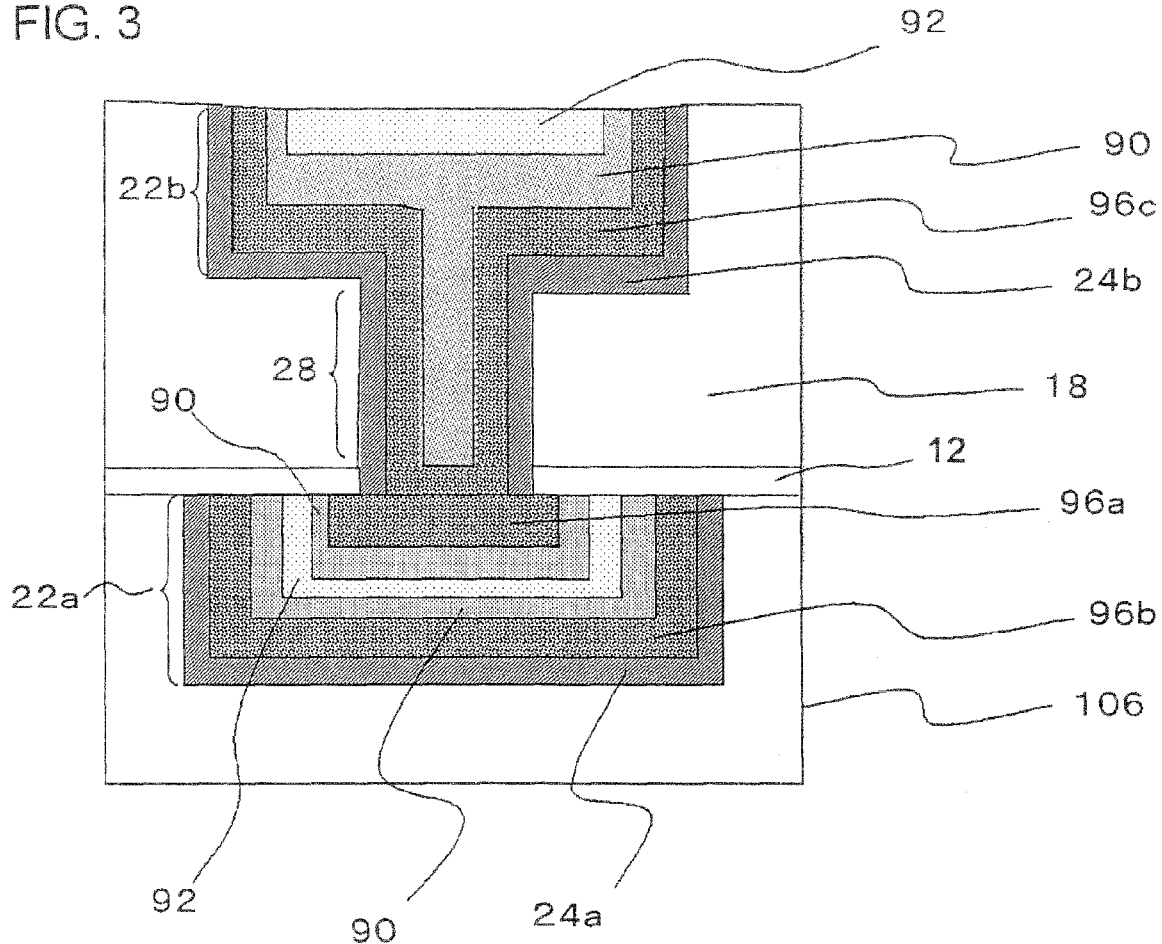

FIG. 13
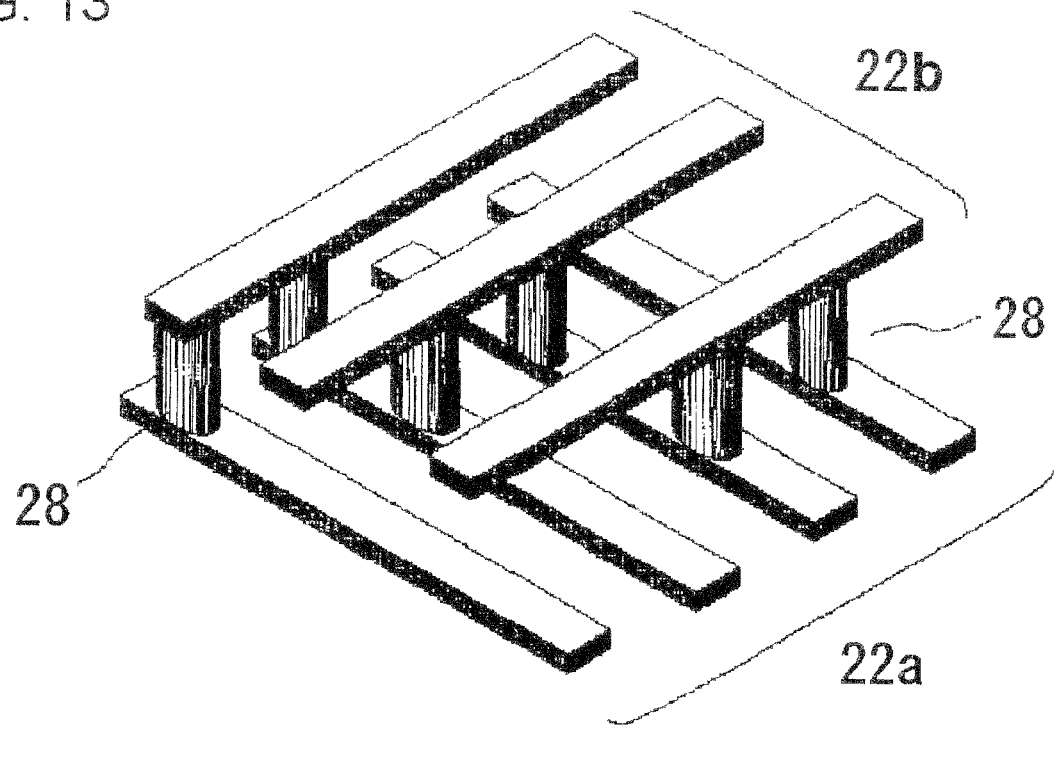
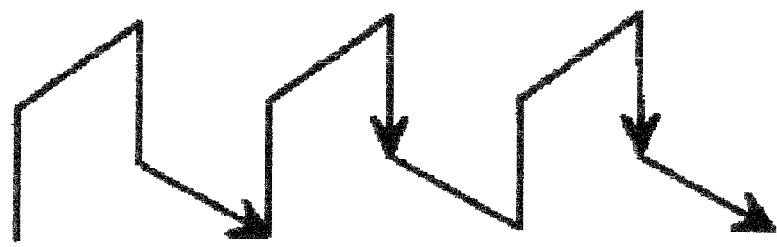
CURRENT PATH

SEMICONDUCTOR DEVICE AND METHOD FOR MANUFACTURING THE SAME This application is based on Japanese patent application NO. 2004-060584, the content of which is incorporated hereinto by reference.

BACKGROUND OF THE INVENTION

1. Field of the Invention

The present invention relates to a semiconductor device and a method for manufacturing the same.

2. Related Art

In recent years, a lower resistance material such as copper and the like has become utilized as an interconnect material, from the requirements for the operating velocity of the semiconductor device.

A damascene process includes a single damascene process for forming only an interconnect with damascene process, and a dual damascene process in which a connection plug and an interconnect are made to form upon conducting also embedding of a connection hole and an interconnect trench.

FIGS. 18A to 18E are cross-sectional views showing a method for forming a connection plug and an interconnect by the dual damascene process. FIG. 18A is a process sectional diagram of a step of forming a first metal interconnect containing copper 220a. There is described the process up to the state of FIG. 18A. Firstly, a first silicon nitride film 212 and a first silicon oxide film 214 are formed on a semiconductor substrate 210 on which an element such as a transistor or the like is formed, after that, a interconnect trench is made to form by dry etching, a barrier metal film 216a and a copper containing metal film 218a are formed in this order so as to embed its inside. After that, the first copper containing metal interconnect 220a is formed upon conducting planarization by a CMP process. Next, a second silicon nitride film 222 and a second silicon oxide film 224 are formed. Thus, a state of FIG. 18A is accomplished.

Next, as shown in FIG. 18B, in the second silicon oxide film 224, a connection hole 226 for a connection plug and a interconnect trench 228 are formed by a lithography technique and an etching. Successively, the etching of the second silicon nitride film 222 is carried out while changing an etching gas. After that, as shown in FIG. 18C, a barrier metal film 230 is entirely formed on the second silicon oxide film 224 containing the connection hole 226 and the interconnect trench 228.

Next, as shown in FIG. 18D, a copper containing metal film 232 is formed on the barrier metal film 230 so as to embed the connection hole 226 and the interconnect trench 228. Next, as shown in FIG. 18E, the planarization by the CMP is performed so as to remove the copper containing metal film 232 and the barrier metal film 230 at the portion other than the interconnect trench 228, owing to this, a connection plug 234 and a second copper containing metal interconnect 220b are formed.

By repeating one series of processes described above, the semiconductor device including a multilayer structure is formed.

However, in the semiconductor device obtained by conventional dual damascene process, since there is provided a barrier metal film between the connecting plug and a lower layer interconnect, there was still room for further improvement in aspect of conductivity between the connecting plug and the lower layer interconnect.

Accordingly, there is disclosed a technique for manufacturing the semiconductor device by the dual damascene process without providing a barrier metal film between the connecting plug and the lower layer interconnect (Japanese Laid-Open Patent Publication NO. 1998-284603). In this technique, such structure schemes reduction of resistance between the connection plug and the lower layer interconnect.

Further, there is also disclosed a technique for forming a barrier metal film at a sidewall of a connection hole and an upper layer interconnect while removing the barrier metal film provided at the bottom of the connection hole that is the technique for manufacturing the semiconductor device by the dual damascene process without providing the barrier metal film between the connection plug and the lower layer interconnect (Japanese Laid-Open Patent Publication NO. 2001-284449). This technique schemes to lessen an electro migration by such manufacturing method.

SUMMARY OF THE INVENTION

It has now been discovered that, however, as described above, when the interconnect and the connection plug are constituted by copper using the conventional dual damascene process, there is the problem that a yield at manufacturing the semiconductor device is not adequate.

Further, in order to stably utilize the semiconductor device over a long term, there is still room for further improvement in aspect of reliability; further improvement is desired to enhance reliability of an element of the semiconductor device. As one of the estimated causes of such problem generation, as described later, it is pointed out that, in the connection portions between the metal interconnect and the connection plug, copper or copper containing metal causes migrations, owing to this, it is easy to form voids.

Here, in the technique disclosed in the Japanese Laid-Open Patent Publication NO. 1998-284603, resistance reduction is schemed between the connection plug and the lower layer interconnect, however, there was still room for further improvement in aspect of yield at manufacturing the semiconductor device.

Further, in the technique disclosed in the Japanese Laid-Open Patent Publication NO. 2001-284449, suppression of the electro migration is schemed; however, there was still room for further improvement in aspect of yield at manufacturing the semiconductor device.

The inventor, as shown in FIG. 14, has found that voids are generated between the connection plug and the copper containing metal interconnect of its lower layer, with the result of examination of a cause that a yield at manufacturing a semiconductor device including a copper containing metal interconnect formed by the dual damascene process is low.

It is conceivable that there are following two cases in producing voids. Firstly, as shown in left side in the FIG. 14, particularly, at the time of heating or cooling in manufacturing process of the semiconductor device, a copper pull up occurs on connection plug 234 portions from the second copper containing metal interconnect 220b of the upper layer, so that, in some cases, there is generated voids at the second silicone nitride film 222 portions and the second silicone oxide film 224 portions.

Secondly, as shown in right side in the FIG. 14, particularly, at the time of heating or cooling in manufacturing process of the semiconductor device, also in the first copper containing metal interconnect of the lower layer, voids are generated at lower periphery of the connection plug 234 caused by shrinkage of the first copper containing metal interconnect of the lower layer. A generation of voids in the first copper containing metal interconnect 220a of the lower layer is easy to occur particularly in wide interconnect in the degree of width 1 to 12 μm.

Further, it has become clear that such generation of voids phenomenon is remarkably generated at about 150° C., which is a temperature for practical application (for instance, bonding process, baking process of photoresist and the like). Since such voids are generated, a connection failure between the connection plug and the interconnect is generated, and it is conceivable generating problems that a yield of the semiconductor device deteriorates, and the semiconductor device becomes unstable state from a long-term use.

FIG. 15 is a diagram explaining principle with possibly one of causes of such voids generation. This diagram illustrates stress added to copper when heating a copper film. In the diagram, a horizontal axis indicates temperature, and a longitudinal axis indicates stress. As illustrated in the diagram, with heating a copper film from ordinary temperature stress applied to the copper film is changed from tensile mode to compressive mode at about 150° C.

The inventor has guessed that cause of the generation of voids is of generation of the stress migration on the copper containing metal in the connection plug and the interconnect in a state that such change of stress mode becomes trigger. In particular, it is conceivable that such stress migration is speeded up in the interface between the connection plug and the interconnect, owing to this, the generation of voids is occurred.

Accordingly, on the basis of the above guess, in order to suppress the stress migration in connection portions between the connection plug and the lower layer interconnect, and to realize superior manufacturing stability or reliability in use in the semiconductor device including copper containing metal interconnects, the inventor has introduced the present invention, as follows:

According to the present invention, there is provided a semiconductor device comprising a substrate, a metal interconnect, which is formed over the substrate, composed of a copper containing metal, and a connection plug, which is composed of a copper containing metal, be provided while being connected to the metal interconnect, wherein the metal interconnect includes different metal elements other than copper, and concentration of the different metal elements in a connection portion between the metal interconnect and the connection plug is higher than a concentration of the different metal element in a center portion of the metal interconnect, and higher than a concentration of the different metal element in an upper portion of the metal interconnect other than the connection portion.

According to the present invention, in the device thus constructed that there is adopted a composition in which different metal elements reside in connection portion between a metal interconnect and a connection plug with high concentration. As described above, the stress migration is remarkably generated at the connection portion between the metal interconnect and the connection plug. According to the present invention, in the device thus constructed that introduced into this connection portion is the different metal element with high concentration, owing to this, stress migration resistance is remarkably improved. As a result, according to the present invention, it is possible to realize excellent manufacturing stability or reliability in use in the semiconductor device including the copper containing metal interconnect.

Further, according to the present invention, there is provided a method for manufacturing a semiconductor device, comprising: forming a first insulating film on a substrate, forming an interconnect trench in the first insulating film, forming a first copper containing metal film in the interconnect trench, forming a second insulating film on the first copper containing metal film, forming a connection hole reaching an upper face of the first copper containing metal film from an upper face of the insulating film, in the second insulating film, forming a seed metal film including a copper element and different metal elements so as to come into contact with an upper face of the first copper containing metal film, on an inner portion of the connection hole, forming a second copper containing metal film so as to come into contact with an upper face of the seed metal film, on an inner portion of the connection hole, and carrying out heat treatment of the first copper containing metal film and the seed metal film.

According to the present invention, in the method thus constructed that a seed metal film including the copper element and the different metal elements is formed in such a way as to come into contact with an upper face of the first copper containing metal film, and the different metal elements are caused to be subjected to thermal diffusion to be distributed into the first copper containing metal film upon making them heat treatment, owing to this, a stress migration is suppressed in the connection portion between the metal interconnect and the connection plug.

As described above, the composition of the present invention is illustrated, however, combined of these compositions arbitrarily is effective as embodiment of the present invention.

For instance, the semiconductor device of the present invention is not limited to a semiconductor device composed of dual damascene interconnect structure, but it may be a semiconductor device composed of single damascene interconnect structure. Further, the semiconductor device of the present invention is not limited to a semiconductor device composed of two-layer interconnect structure, but it may be a semiconductor device composed of interconnect structure not less than three layers.

According to the present invention, composition, is that concentration of the different metal, in specified region within the metal interconnect is high, therefore, it is possible to realize excellent manufacturing stability or reliability in use in the semiconductor device including copper containing metal interconnect.

BRIEF DESCRIPTION OF THE DRAWINGS

The above and other objects, advantages and features of the present invention will be more apparent from the following description taken in conjunction with the accompanying drawings, in which:

FIG. 3 is a sectional view showing distribution of different metal a concentration in the copper containing metal interconnect provided for a portion of interconnect structure in the semiconductor device;

FIG. 13 is an outline view of a two-layer interconnect structure used for evaluations of a stress migration resistance of the interconnect structure of the copper containing metal interconnect of the semiconductor device;

DETAILED DESCRIPTION OF THE INVENTION

Figure 1:
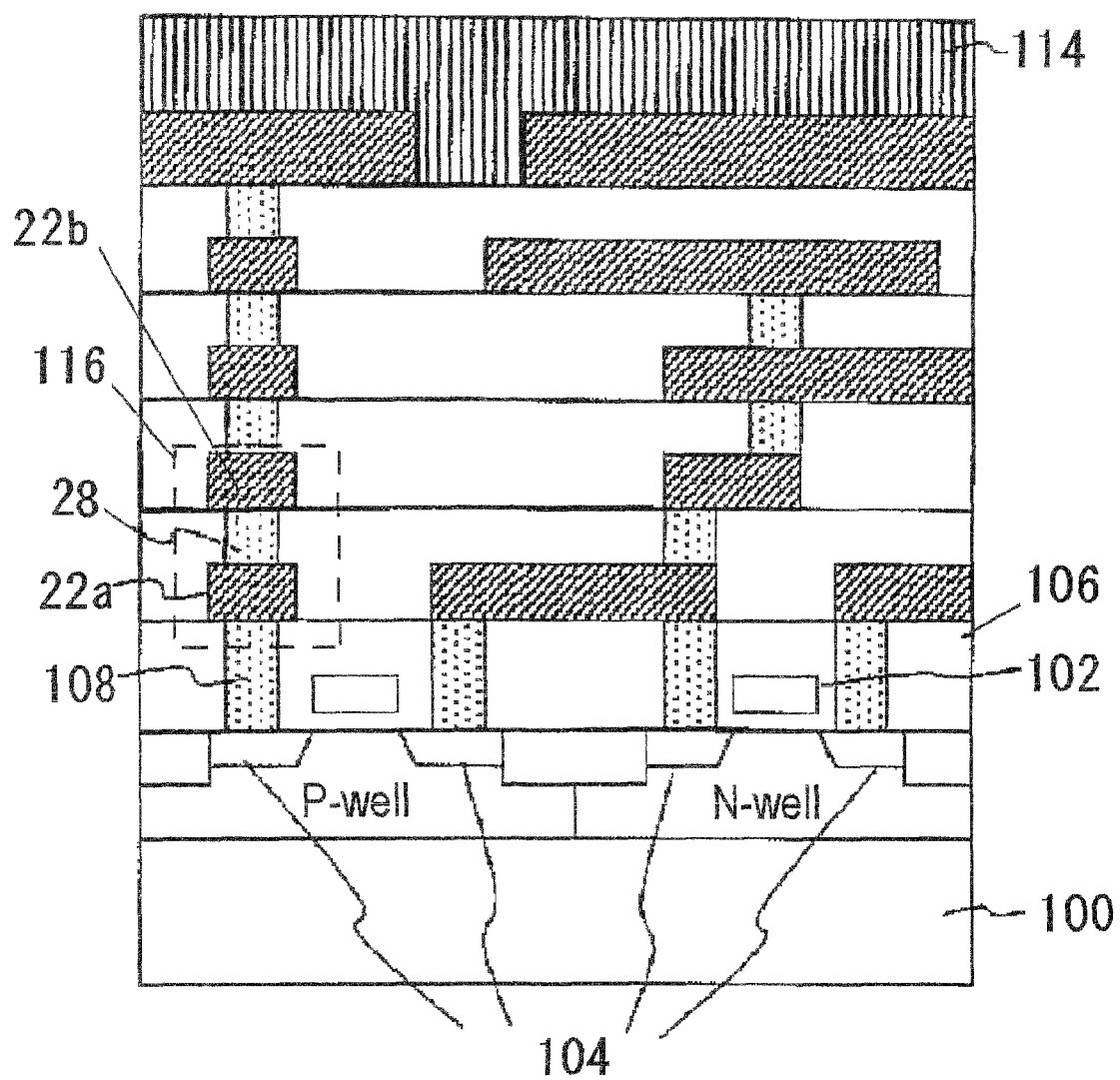
FIG. 1 is a sectional view showing one example of a semiconductor device in which a copper containing metal interconnect is formed.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Further, according to the present invention, in the semiconductor device described above, there is provided a semiconductor device comprising different metal high concentration region, which includes different metal elements with higher concentration than a center portion of the metal interconnect in at least one vicinity of side face and bottom face of the metal interconnect.

According to the present invention, in the device thus constructed that there is adopted a composition in which different metal elements with high concentration reside in the vicinity of bottom face or side face of the metal interconnect. As described above, a stress migration is remarkably generated at connection portion between the metal interconnect and the connection plug. According to the present invention, in the device thus constructed that owing to the fact that the different metal elements with high concentration are introduced in the vicinity of the bottom face or the side face of the metal interconnect, so that there is a function to fasten the metal interconnect as a whole, thus a copper pull up in the vertical direction and a shrinkage of the metal interconnect in the horizontal direction are suppressed, owing to this, a stress migration resistance is remarkably improved.

Further, according to the present invention, in the semiconductor device described above, there is provided a semiconductor device in which the different metal elements are not less than one kind of elements selected from a group composed of Sn, Al and Ti.

According to the present invention, the different metal elements are of not less than one kind of elements selected from the group composed of Sn, Al and Ti, owing to this, when compared to the case of using another elements; a stress migration in the region where concentration of the different metal elements is high is remarkably suppressed.

Different metal elements in the present specification mean metal elements other than copper, and mean the element more than one kind selected from among the elements such as, for example, Al, Ag, W, Mg, Be, Zn, Pd, Cd, Au, Hg, Be, Pt, Zr, Ti or Sn or the like. It should be noted that Si is not included in the different metal element. These different metal elements are capable of suppressing a stress migration without largely lowering conductivity of the copper containing metal film. When using the element more than one kind selected from group consisting of Sn, Al and Ti among them, a balance between suppressing the increase of a resistance and suppressing of the stress migration becomes good.

In the specification, "alloy" means that metal elements more than two kinds are made to fuse and solidify; and that nonmetal or semimetal element other than metal element is contained in the metal element is called as alloy. Further, as a state of texture of the alloy, there are two cases on the basis of the behavior in a state that the componential elements are mixed. That is, one state of texture of the alloy is of the case that a solid solution or an intermetallic compound is formed, and the other state of texture of the alloy is of the case that mixture of the solid solution and the intermetallic compound is constituted. That is, in the present specification, a matter to which component more than a solid solubility limit is added is called as "alloy".

In the present specification, the center portion of the interconnect means vicinity of interconnect section center. That is, it means region except for an upper face portion, a bottom face portion and a side face portion.

In the present specification, the copper containing metal is a metal, for instance, which has the content of copper not less than 30%. Further, the copper containing metal may contain gold, silver, platinum or the like. The copper containing metal may contain chromium, molybdenum, or the like.

In the semiconductor device provided by the present invention, different metal elements contained in the above described connection portion may be formed in such a way that the different metal elements are made to contain into the connection portion due to the thermal diffusion.

According to a configuration for causing the different metal elements to distribute in the metal interconnect by the thermal diffusion, it is possible to adjust easily concentration of the different metal element in the connection portion, therefore, a balance between suppression of the increase of resistance in the semiconductor device including the copper containing metal interconnect and a suppression of the stress migration may be rendered to be good.

The concentration of the different metal element in the above-described connection portion may be not less than 0.01 atom % and not more than 10 atom %.

According to this configuration, it is possible to suppress the stress migration while ensuring a favorable conductivity in the connection portions.

A concentration of different metal elements in the above-described connection portions may be higher than concentration of different metal elements in the center portion of the connection plug.

According to this configuration, it is possible to effectively suppress the stress migration in the connection portions while ensuring a favorable conductivity in the center portion of the connection plug.

In the above-described semiconductor device, there may be provided different metal high concentration region extending for the whole side face or the whole bottom face of the metal interconnect.

According to this configuration, it is possible to effectively suppress the stress migration upon preventing a shrinkage of the metal interconnect or the like while fixing the metal interconnect in connection with its whole side face or whole bottom face.

The different metal elements contained in the whole side face or the whole bottom face of the above-described metal interconnect are made to contain in the connection portions due to the thermal diffusion.

According to the configuration for causing the different metal elements to distribute in the metal interconnect by the thermal diffusion, it is possible to adjust easily concentration of the different metal element in the whole side face or the whole bottom face of the metal interconnect, therefore, a balance between suppression of the increase of resistance in the semiconductor device including the copper containing metal interconnect and suppression of the stress migration may be rendered to be good.

The concentration of the different metal elements in the above-described different metal high concentration region may be not less than 0.01 atom % and not more than 10 atom %.

According to this configuration, it is possible to suppress the stress migration while ensuring a favorable conductivity in the above-described different metal high concentration region.

The above-described semiconductor device further may comprise an insulating film provided over the substrate and a barrier metal film provided between the insulating film and the metal interconnect; and the different metal high concentration region may be provided to extend for the whole of inner surface of the barrier metal film.

According to this configuration, diffusion of the different metal elements toward the insulating film is prevented due to existence of the barrier metal film. Further, the stress migration in the region near to the barrier metal film among the metal interconnects is prevented, while ensuring a favorable conductivity in the center portion of the metal interconnects.

In the above-described method for manufacturing the semiconductor device, a process for forming the first copper containing metal film may include a process for forming a lower layer seed metal film containing copper element and the different metal elements in an interconnect trench, and a process for forming the first copper containing metal film so as to come into contact with upper face of the lower layer seed metal film in the interconnect trench. Further, the above-described method for manufacturing the semiconductor device may be further provided with a process for performing heat treatment of both of the first copper containing metal film and the lower layer seed metal film.

According to this process, it is possible to form the different metal high concentration region on a region near to the bottom face or the side face of the metal interconnect, therefore, it is possible to effectively suppress the stress migration in the vicinity of the bottom face or the side face of the above-described metal interconnect.

Further, a process for forming the above-described seed metal film may include a process for forming a seed metal film containing not less than one kind of elements selected from a group composed of Sn, Al and Ti as the different metal elements.

According to this process, the stress migration at the region where the different metal elements are distributed from the seed metal film due to the thermal diffusion is effectively suppressed.

Further, a process for forming the above-described lower layer seed metal film may include a process for forming a lower layer seed metal film containing not less than one kind of elements selected from a group composed of Sn, Al and Ti as the different metal elements.

According to this process, the stress migration in the region where the different metal elements are distributed from the lower layer seed metal film due to the thermal diffusion is effectively suppressed.

There will be described embodiments of the present invention with reference to the drawings below. It should be noted that, in the whole drawings, the same sign is added to the same composing elements to appropriately omit the explanation.

First Embodiment

FIG. 1 is a sectional view showing one example of a semiconductor device in which a copper containing metal interconnect is formed. On the silicon substrate 100, a MOS transistor, which is composed of a gate electrode 102, a diffusion layer 104 and the like, is formed. An insulating film 106 is formed so as to embed this MOS transistor. A copper connection plug 108 connected to the diffusion layer 104 is provided in the insulating film 106; and a first copper interconnect 22a, a connection plug 28 and a second copper interconnect 22b are formed in this order at the upper portion of the copper connection plug 108. At the upper portion of a layer containing these copper interconnects, copper interconnect layers composed of the same structure are formed, and, at the top portion thereof, a passivation film 114 is provided. The first copper interconnect 22a is electrically connected to elements formed on the silicon substrate 100. Further, the first copper interconnect 22a, the connection plug 28 and the second copper interconnect 22b described later may be provided at which layer of the semiconductor device shown in FIG. 1.

There will be described a dual damascene interconnect structure in the present embodiment below.

Figure 2A:
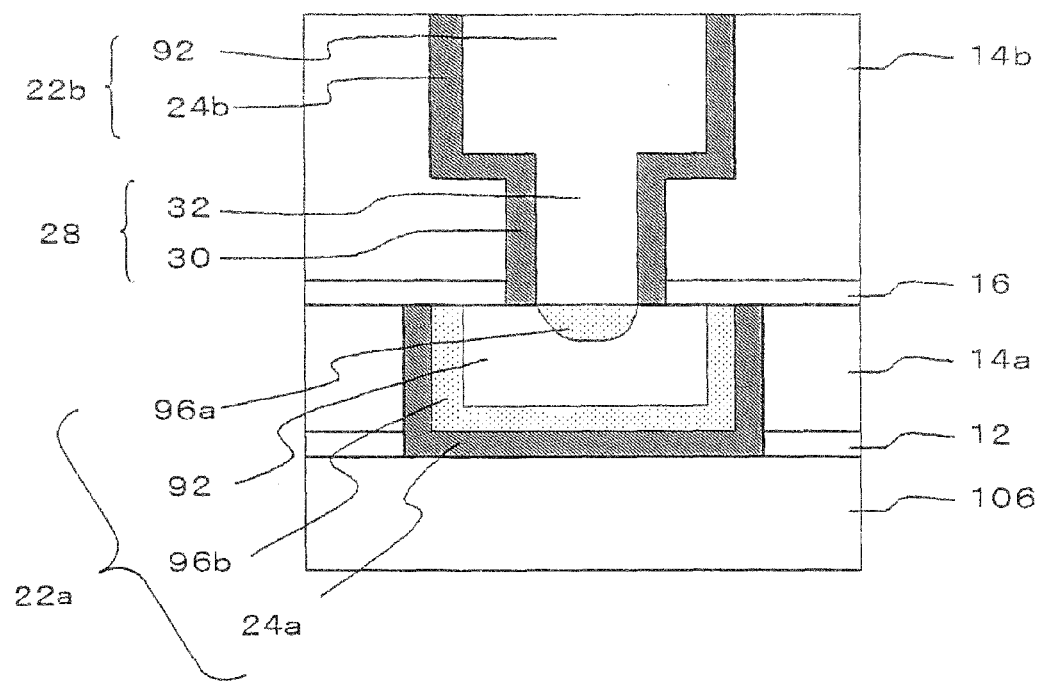
FIGS. 2A and 2B are sectional views showing portions of interconnect structure of the copper containing metal interconnect in the semiconductor device.
Figure 2B:
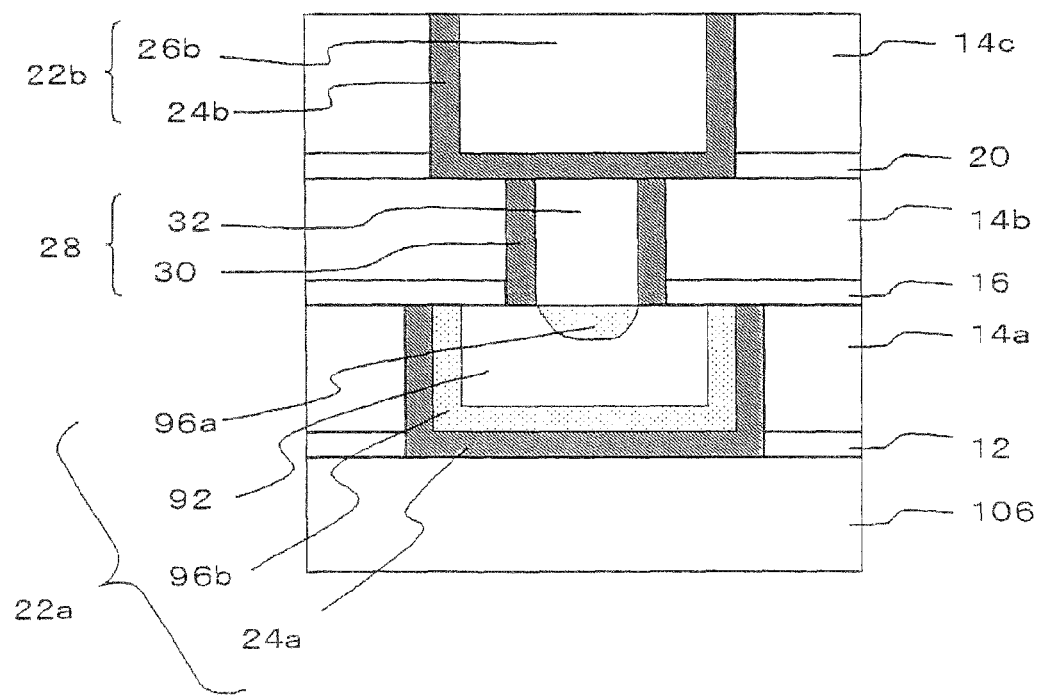

FIGS. 2A and 2B are sectional views showing a portion of the interconnect structure of the copper containing metal interconnect in the semiconductor device. It should be noted that FIGS. 2A and 2B correspond to an enlarged view of the interconnect structure of dotted line surrounded portion 116 of FIG. 1. FIG. 2A indicates the case of dual damascene structure, and FIG. 2B indicates the case of single damascene structure.

In the dual damascene structure of FIG. 2A, on the insulating film 106 on the silicon substrate (not shown in the drawings), a first SiCN film 12, a first multilayered film 14a in which a SiOC film and a SiO$_2$ film are formed in this order, a second SiCN film 16 and a second multilayered film 14b in which a SiOC film and a SiO$_2$ film are formed in this order, are formed in the above-described order. The first copper interconnect 22a is formed in the first multilayered film 14a. Further, the second copper interconnect 22b and the connection plug 28 are formed in the second multilayered film 14b.

The first copper interconnect 22a is composed of respective tantalum containing barrier metal film 24a and a copper containing metal film. This copper containing metal film includes different metal high concentration regions 96a, 96b with high Al concentration, to be the different metal element, and a different metal low concentration region 92 with low Al concentration, to be the different metal element.

The connection plug 28 connected to an upper face of the first copper interconnect 22a is formed within the second multilayered film 14b. The connection plug 28 is composed of a tantalum containing barrier metal film 30 and a copper containing metal film 32.

A second copper interconnect 22b connected to an upper face of a connection hole is formed within the second multilayered film 14b. The second copper interconnect 22b is composed of a tantalum containing barrier metal film 24b and a copper containing metal film.

According to this configuration, the barrier metal film 24b does not exist between the first copper interconnect 22a and the connection plug 28 of its upper portion, and the first copper interconnect comes into directly contact with the connection plug 28, therefore, it is possible to improve a conductivity of the semiconductor device including the copper containing metal interconnect.

Further, there is provided the different metal high concentration region 96a with high concentration of Al to be the different metal element at the interface vicinity between the first interconnect 22a and the connection plug 28 within the first interconnect 22a, therefore, it is possible to suppress the stress migration in this different metal high concentration region 96a.

Further, according to this configuration, there is provided the different metal high concentration region 96b with high concentration of Al to be the different metal element in the vicinity of the bottom face or the side face of the first interconnect 22a, therefore, it is possible to suppress the stress migration in this different metal high concentration region 96b.

Figure 17:
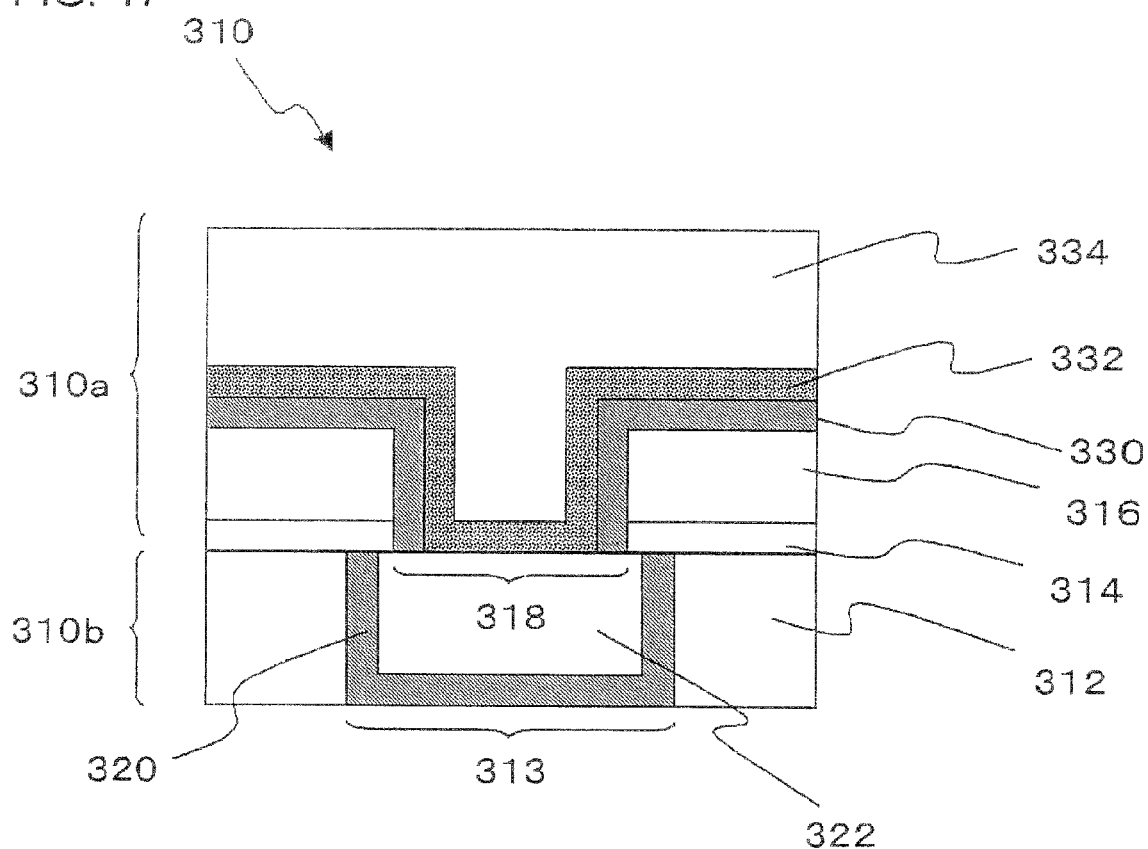
FIG. 17 is a sectional view showing a manufacturing method in which a seed metal film is formed on the interconnect of the upper portion and the connection plug in the semiconductor device manufactured by the conventional dual damascene process.
Figure 18A:
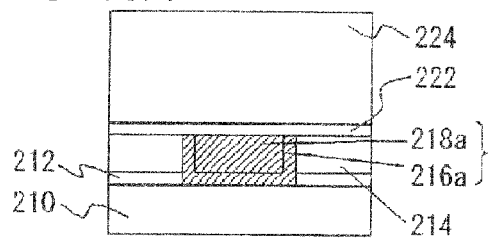
FIGS. 18A to 18E are sectional views showing a method for forming the connection plug and the interconnect in the semiconductor device manufactured by the conventional dual damascene process.
Figure 18B:
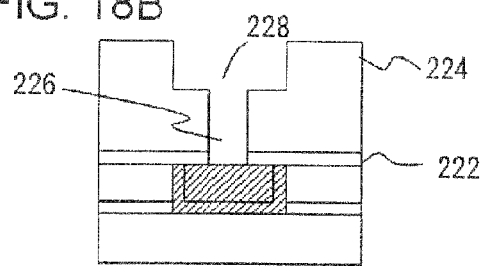
Figure 18C:
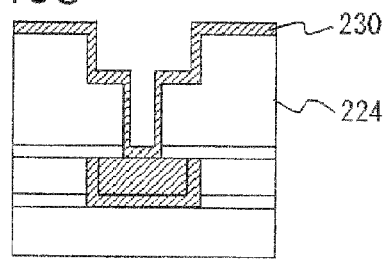
Figure 18D:
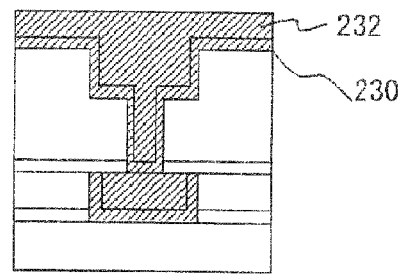
Figure 18E:
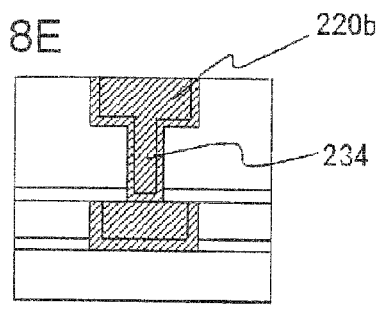

Here, in the Japanese Laid-Open Patent Publication NO. 1998-284603, there is disclosed the technique for manufacturing the semiconductor device by the dual damascene process without providing a barrier metal film between the connection plug and the interconnect of the lower layer. FIG. 17 shows the specific interconnect structure in this technique. FIG. 17 is, in the semiconductor device manufactured by the conventional dual damascene process described in the Japanese Laid-Open Patent Publication NO. 1998-284603, a sectional view in which the seed metal film is formed on the interconnect in the upper portion and the connection plug.

Specifically, the semiconductor device is provided with flattening interconnect structure 310 provided with at least one layer of via level 310a. The metal level 310b has at least one insulation portion 312, and at least one interconnect 313. The interconnect 313, which has the barrier metal film 320 at the sidewall and the bottom of the interconnect 313, is filled with a metal film 322. The via level 310a of the interconnect structure is composed of at least one connecting plug 318 and an insulating layer 316. Furthermore, the via level 310a is generally separated from the metal level 310b by a dielectric film 314. According to this configuration, a decrease of the resistance between the connection plug and the interconnect of the lower layer is schemed.

Further, this semiconductor device provided with a conductive layer 332 and a metal layer 334 above a liner 330. This literature describes that, as the conductive layer 332 when forming the interconnect of the upper layer, there may be used alloys having Cu, Al or the like.

However, the Japanese Laid-Open Patent Publication NO. 1998-284603 does not mention a proper action and an effect at all in the case that such alloy composed of Cu and Al is used as the conductive layer 332. Further, there is no reference with respect to the proper action and the effect owing to the fact that only connection portion of an upper face of the interconnect of the lower layer includes the different metal element with high concentration. Furthermore, the Japanese Laid-Open Patent Publication NO. 1998-284603 does not describe at all that the seed metal film is provided to the bottom face or the side face of the interconnect of the lower layer.

On the other hand, in the semiconductor device of the present embodiment shown in FIGS. 2A and 2B, there is provided the different metal high concentration region 96a with high concentration of Al to be the different metal element in the interface vicinity between the first interconnect 22a and the connection plug 28 within the first interconnect 22a, therefore, it is possible to suppress the stress migration in the different metal high concentration region 96a.

Further, there is provided the different metal high concentration region 96b with high concentration of Al to be the different metal element in the vicinity of the bottom face or the side face of the first interconnect 22a, therefore, it is possible to suppress the stress migration in the different metal high concentration region 96b.

Figure 14:
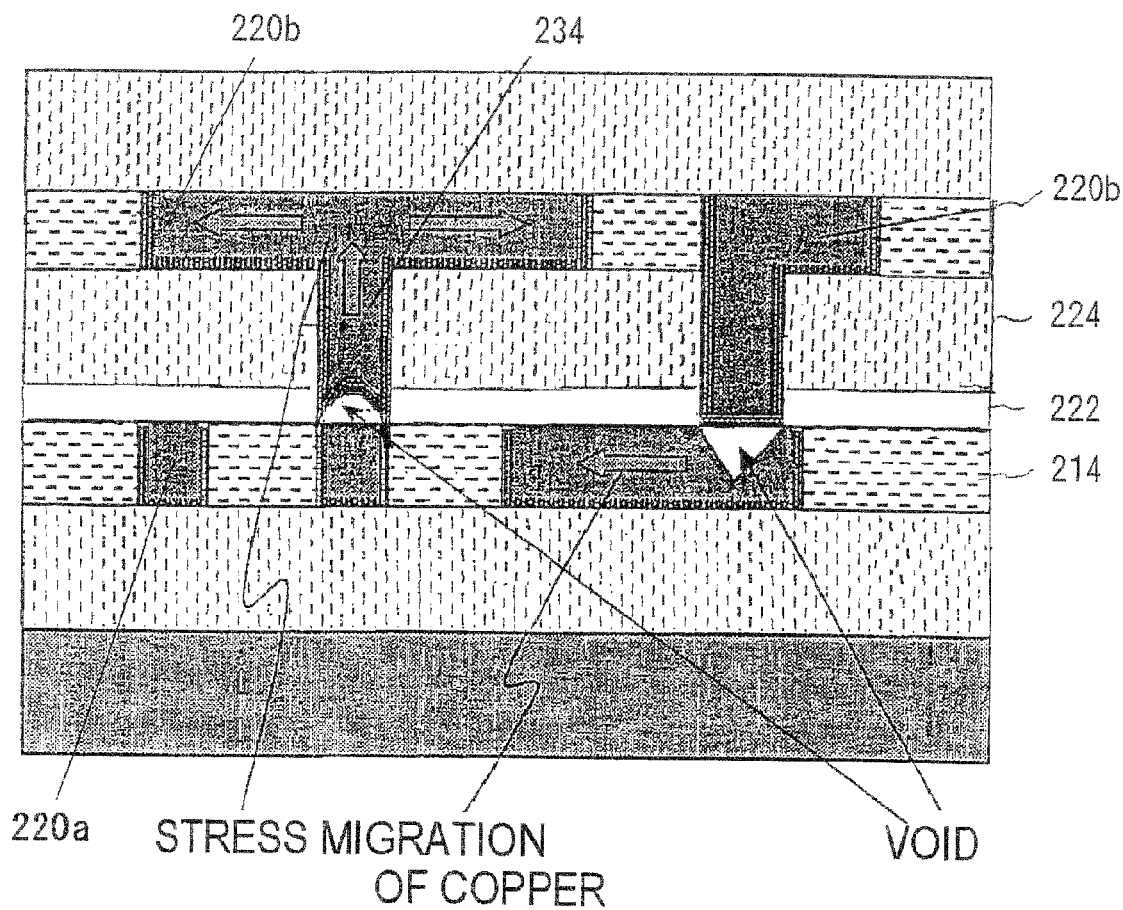
FIG. 14 is a sectional view showing voids generation between the connection plug and the copper interconnect of its lower layer in the semiconductor device manufactured by the conventional dual damascene process.
Figure 15:
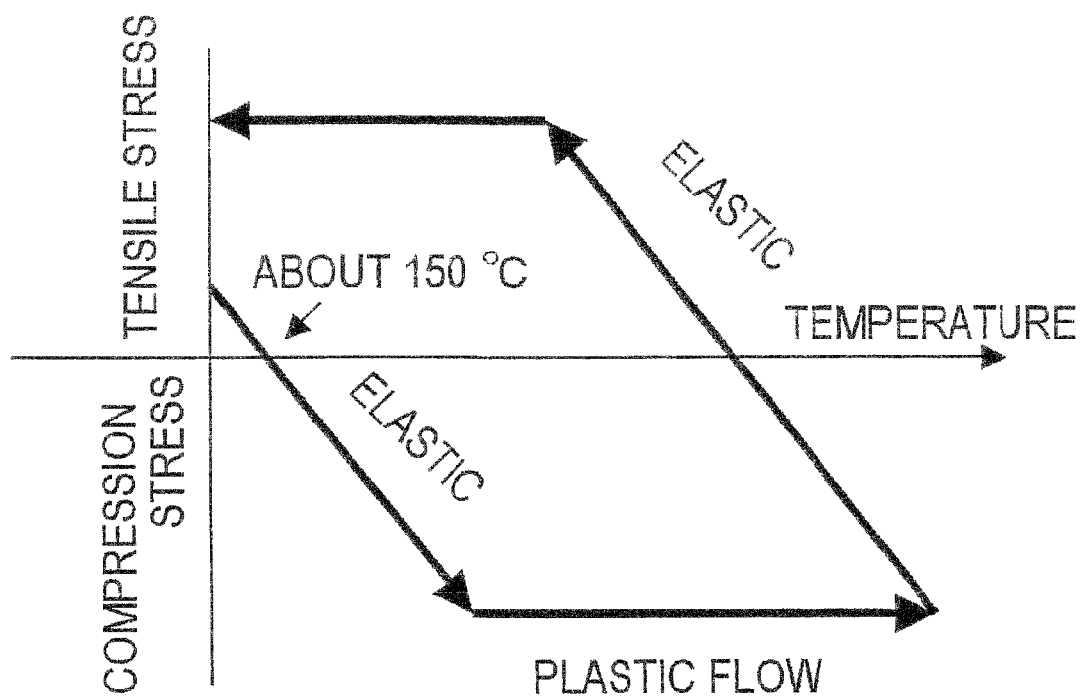
FIG. 15 is a graphical representation for explaining principle of conceivable one of causes by which voids are generated between the connection plug and the copper interconnect of its lower layer in the semiconductor device manufactured by the conventional dual damascene process.

Further, by combining these configurations, the copper pull up from the connection plug 28 is made to suppress; and it is possible to suppress the shrinkage of the first copper interconnect 22a. That is, it is possible to effectively suppress both two principal causes of the voids generation in the connection portion between the first copper interconnect 22a and the connection plug 28 as shown in FIG. 14 (copper pull up in the vertical direction, and the first copper interconnect shrinkage in the horizontal direction).

As a result, in the semiconductor device of the present embodiment, it is possible to sharply decrease the voids generation in the connection portions, and it is possible to more effectively improve a yield of the semiconductor device containing the copper containing metal interconnect. As described above, according to the semiconductor device and the method for manufacturing the semiconductor device provided by the present invention, it is possible to remarkably enhance the stability of the element of the semiconductor device.

Second Embodiment

There will be described a single damascene interconnect structure in the present embodiment below.

In the single damascene structure in FIG. 2B, on the insulating film 106 on the silicon substrate (not shown in the drawings), the first SiCN film 12, the first multilayered film 14a in which a SiOC film and a SiO₂ film are formed in this order, the second SiCN film 16, the second multilayered film 14b in which a SiOC film and a SiO₂ film are formed in this order, the third SiCN film 20 and the third multilayered film 14c in which a SiOC film and a SiO₂ film are formed in this order, are formed in the above described order. The first copper interconnect 22a, the connection plug 28 and the second copper interconnect 22b are formed within the first multilayered film 14a, the second multilayered film 14b and the third multilayered film 14c respectively.

The first copper interconnect 22a is composed of respective a tantalum containing barrier metal film 24a and a copper containing metal film. In this copper containing metal film, different metal high concentration regions 96a, 96b with high concentration of Al to be the different metal element and a different metal low concentration region 92 with low concentration of Al to be the different metal element are included.

Within the second multilayered film 14b, the connection plug 28 connected to an upper face of the first copper interconnect 22a is formed. The connection plug 28 is composed of a tantalum containing barrier metal film 30 and a copper containing metal film 32. The copper containing metal film 32 includes a different metal low concentration region with low concentration of Al to be the different metal element.

Within the third multilayered film 14c, the second copper interconnect 22b connected to the upper face of the connection plug 28 is also formed. The second copper interconnect 22b is composed of a tantalum containing barrier metal film 24b and a copper containing metal film 26b. The copper containing metal film 26b includes the different metal low concentration region with low concentration of Al to be the different metal element.

According to this configuration, there is provided the different metal high concentration region 96a with high concentration of Al to be the different metal element in the interface vicinity between the first interconnect 22a and the connection plug 28 within the first interconnect 22a, owing to this, it is possible to suppress the stress migration in the different metal high concentration region 96a.

Further, according to this constitution, there is provided the different metal high concentration region 96b with high concentration of Al to be the different metal in the vicinity of the bottom face or the side face of the first interconnect 22a, owing to this, it is possible to suppress the stress migration in the different metal high concentration region 96b.

Further, by combining these configurations, like the case of the dual damascene interconnect structure, it is possible to effectively suppress both two principal causes of the voids generation in the connection portion between the first copper interconnect 22a and the connection plug 28 (copper pull up in the vertical direction, and the first copper interconnect shrinkage in the horizontal direction). For this reason, it is possible to suppress the generation of the connection failure between the connection plug 28 and the first interconnect 22a.

Third Embodiment

There will be described the dual damascene structure in the present embodiment below.

FIG. 3 is a sectional view showing distribution of a different metal concentration within the copper containing metal interconnect provided to the portions of the interconnect structure in the semiconductor device. In the dual damascene structure in FIG. 3, on the first insulating film 106 on the silicon substrate (not shown in the drawings), the SiCN film 12 and the second insulating film 18 are formed in this order.

The first interconnect 22a is formed within the first insulating film 106. The tantalum containing barrier metal film 24a, the different metal high concentration regions 96a, 96b and the different metal intermediate concentration region 90 are included in the first interconnect 22a.

Further, the connection plug 28 and the second copper interconnect 22b are formed within the second insulating film 18. In the connection plug 28, a tantalum containing barrier metal film 24b, a different metal high concentration region 96c and a different metal intermediate concentration region 90 are included in the connection plug 28. The tantalum containing barrier metal film 24b, the different metal high concentration region 96c, the different metal intermediate concentration region 90 and the different metal low concentration region 92 are included in the second copper interconnect 22b.

According to the configuration, an alloy concentration of the different metal high concentration region 96a in a surface vicinity of the first interconnect existing at lower portion of the connection plug 28 (hereinafter described appropriately as via plug) becomes high, owing to this, it is possible to suppress the stress migration of Cu, to suppress the generation of voids at lower portion of the connection plug 28, and to decrease an interconnect breakage occurrence.

Further, it is possible to improve the electro migration resistance and the stress migration, upon allowing the first interconnect 22a itself due to a diffusion of the different metal from the bottom and the sidewall portion of the first interconnect 22a.

Further, the barrier metal film 24b does not reside between the first interconnect 22a and the connection plug 28; therefore, it is possible to improve the conductivity of the semiconductor device.

According to the above-described constitution, the different metal element is intensively diffused with the high concentration in the region where voids particularly occur easily caused by the influence of the stress migration among lower portions of the connection plug 28 without entirely distributing the different metal element over the first interconnect 22a with the high concentration. Further, the different metal element is intensively distributed in the vicinity of the bottom face or the side face of the first interconnect 22a with high concentration, so that the stress migration of whole the first interconnect 22a is made to suppress effectively.

On the other hand, in the region such as the center portion of the first interconnect 22a, where is relatively difficult to be affected by the stress migration, the different metal element is not distributed with high concentration, therefore, there is an advantage capable of suppressing the increase of the resistance of the first interconnect 22a, while effectively suppressing the stress migration.

Further, according to the configuration, the concentration of the different metal element in the different metal high concentration region 96a residing in the connection portion between the first interconnect 22a and the connection plug 28 within the first interconnect 22a is higher than the concentration of the different metal element in the center portion of the first interconnect 22a, and higher than the concentration of the different metal element in the first interconnect 22a upper face portion except for the connection portion.

More particularly, according to the configuration, the concentration of the different metal element in the different metal high concentration region 96a is higher than the concentration of the different metal element in the center portion of the first interconnect 22a, and higher than the concentration of the different metal element in the first interconnect 22a upper face portion except for the connection portion and both the side portions of the first interconnect 22a.

For that reason, the different metal element with high concentration is intensively distributed in the region where voids easily occur particularly by the influence of the stress migration, at a lower portion of the connection plug 28. On the other hand, in a region that is hard to be affected by the stress migration, the concentration of the different metal element is relatively low. Owing to this, there are advantages capable of suppressing the generation of voids at the lower portion of the connection plug 28, without increasing resistance of the first interconnect 22a more than necessity.

FIG. 3 is a sectional view, and a substantial damascene interconnect is provided with three-dimensional interconnect structure, therefore, a portion in which connection plug 28 is formed within the first interconnect 22a is extremely small. Consequently, in interconnect extension direction perpendicular to a space of FIG. 3, the different metal element with high concentration is distributed at only a portion corresponding to a via bottom of the interconnect upper face. For this reason, in another portion, the different metal element concentration is low, so that the increase of the resistance as a whole is suppressed.

Further, according to the constitution, also in a region near to a sidewall of the connection plug 28, the different metal element with relatively high concentration is distributed. For this reason, it is possible to effectively suppress the Cu pull up element from the first interconnect 22a, by the connection plug 28. On the other hand, in the center portion of the connection plug 28, the concentration of the different metal element is relatively low, owing to this; it is possible to suppress the increase of the resistance of the connection plug 28.

Further, according to the constitution, also in regions near to a sidewall of the second interconnect 22b, the different metal element with relatively high concentration is distributed. Owing to this, it is possible to effectively suppress that the second interconnect 22b pulls up Cu element from the first interconnect 22a via the connection plug 22a. On the other hand, in the center portion of the second interconnect 22b, since the concentration of the different metal element is relatively low, it is possible to suppress the increase of the resistance of the second interconnect 22b.

It should be noted that, concerning the above-described concentration distribution of the different metal element, its manufacturing method is not limited particularly. The concentration distribution of the different metal element is capable of being formed easily by causing the different metal element to be subjected to thermal diffusion into the copper containing metal film from a seed metal film including the Cu element and the different metal element due to heat treatment in a later described embodiment.

There will be described a concentration profile of the different metal element in the present embodiment.

Figure 4:
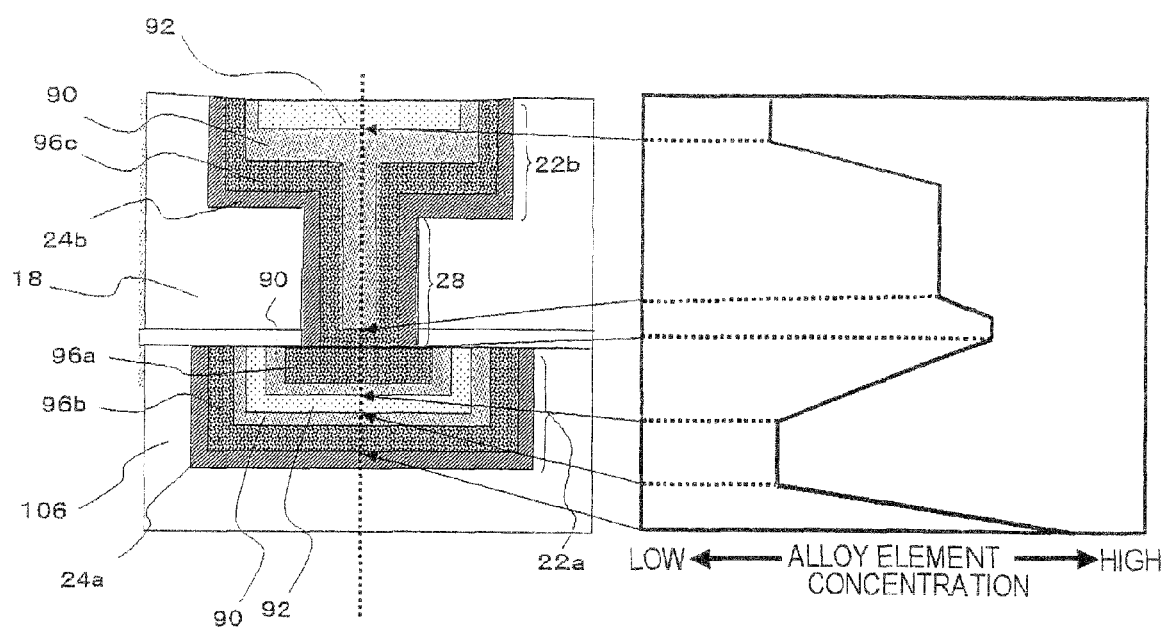
FIG. 4 is a sectional view showing distribution of different metal concentration in the copper containing metal interconnect provided for a portion of interconnect structure in the semiconductor device, and a graphical representation showing summary of corresponding concentration profile.

FIG. 4 is a sectional view showing a distribution of the different metal concentration in the copper containing metal interconnect provided for portions of the interconnect structure in the semiconductor device, and a graphical representation showing a summary of corresponding concentration profile. A left side sectional view is a sectional view showing a portion of the semiconductor device providing the dual damascene interconnect structure of the present embodiment. Further, a right side graphical representation is a graphical representation representing a summary of the profile of the concentration of the different metal element along the center line of the left side damascene interconnect structure.

There will be described the concentration profile while tracing the center line from upper portion. First, in the upper portion of the second interconnect 22b, a region 92 in which the concentration of the different metal element is relatively low resides. Owing to this, a conductivity of the region 92 is relatively favorable.

Next, in the lower portion from the center portion of the second interconnect 22b, a region 90 that the concentration of the different metal element becomes relatively higher resides. Owing to this, in this region 90, the stress migration is suppressed in a certain degree with a conductivity decrease remaining small.

Successively, in the center portion from the upper portion of the connection plug 28, a region 90 that the concentration of the different metal element becomes relatively higher resides. Owing to this, also in this region 90, the stress migration is suppressed in a certain degree with a conductivity decrease remaining small.

And, in the upper portion of the first interconnect 22a from the lower portion of the connection plug 28, a region 96a where the concentration of the different metal element is remarkably high resides. For this reason, in this region 96a, conductivity deteriorates slightly, however, it is possible to effectively suppress the stress migration. Further, this region 96a occupies only small portion within the whole dual damascene interconnect structure; therefore, it is possible to suppress the increase of the resistance as a whole.

Next, in the center portion of the first interconnect 22a, at first, a region 90 where the concentration of the different metal element is relatively high resides. Owing to this, in this region 90, the stress migration is suppressed in a certain degree with a conductivity decrease remaining small.

Successively, in the center portion of the first interconnect 22a, a region 92 of next lower concentration of the different metal element resides. Owing to this, a conductivity of this region 92 is relatively favorable.

And, in the center portion of the first interconnect 22a, further, a region 90 where the concentration of the different metal element is relatively high resides. Owing to this, in this region 90, the stress migration is suppressed in a certain degree with a conductivity decrease remaining small.

Successively, in the lower portion of the first interconnect 22a, a region 96b where the concentration of the different metal element remarkably high resides. For this reason, in the region 96b, conductivity slightly deteriorates; however, it is possible to effectively suppress the stress migration. Further, the region 96b occupies only slight portion within the whole dual damascene interconnect structure; therefore, an increase of the resistance as a whole can be suppressed.

The semiconductor device provided with the dual damascene interconnect structure of the present embodiment has such concentration profile as a whole, therefore, it is possible to suppress the stress migration while suppressing a conductivity deterioration of the semiconductor device.

In the semiconductor device of the above-described present embodiment, the second interconnect is formed dual damascene process together with the connection plug; however, it may be formed by the single damascene process, after forming the connection plug. Also, in the case of such single damascene structure, it is possible to form the same concentration profile as described later, therefore, it is possible to effectively suppress the stress migration while suppressing an increase of the resistance.

Further, as for the different metal concentration of respective regions of the semiconductor device of the present embodiment, it is possible to control a quantity of the different metal diffusing down into the copper containing metal film on the occasion of annealing upon adjusting the concentration of the different metal included in a seed metal layer described later, as a result, it is possible to easily control the different metal concentration of the respective regions within the copper containing metal film.

There will be described an evaluation method of the stress migration resistance in the present invention below.

FIG. 13 is an outline view of a two-layer interconnect structure used for an evaluation of the stress migration resistance of the interconnect structure of the copper containing metal interconnect in the semiconductor device. As for a stress migration suppression effect of the semiconductor device provided with the dual damascene interconnect structure or the single damascene interconnect structure like the semiconductor device of the present embodiment, it is possible to evaluate the suppression effect upon measuring yield of via chain resistance as described below, while manufacturing a two-layer interconnect structure as shown in FIG. 13.

The two-layer interconnect structure is so called as a via chain, in a state where ten thousand of the first copper interconnects 22a are provided in parallel, at right angle to them, ten thousand of the second copper interconnects 22b are provided in parallel. These interconnects therebetween are connected by twenty thousand of the connection plugs 28. Within the drawing, a semiconductor substrate and an interlayer insulating film and the like are not shown. When applying predetermined voltage to two points of end portions of the via chain, current flows in the direction indicated by arrow line within the drawing. Owing to this, an electrical resistance via ten thousand of the first copper interconnects 22a, ten thousand of the second copper interconnects 22b and twenty thousand of the connection plugs 28 are measured.

Fourth Embodiment

There will be described a manufacturing method according to dual damascene of the semiconductor device of the present embodiment.

FIGS. 5A to 5E and FIGS. 6F to 6J are sectional views showing a method for manufacturing the interconnect structure of the copper containing metal interconnect in the above described semiconductor device. FIGS. 5A to 5E show first half process of the method for manufacturing the semiconductor device provided with the dual damascene interconnect structure in the present embodiment, and FIGS. 6F to 6J show its late manufacturing method.

Figure 5A:
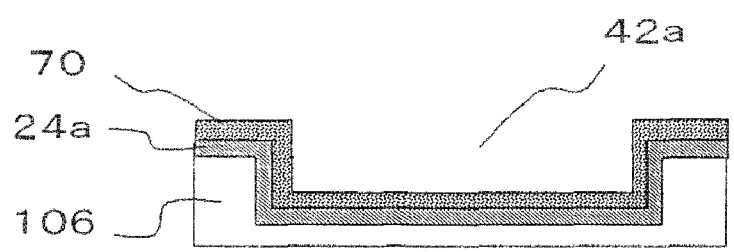
FIGS. 5A to 5E are sectional views showing a method for manufacturing an interconnect structure of the copper containing metal interconnect in the semiconductor device.

FIG. 5A shows a structure in which an interconnect trench is formed in the first insulating film 106. In order to form this structure, first, the first insulating film 106 is formed on the upper portion of the substrate (not shown in the drawings), after that, a resist film (not shown in the drawings) being subjected to patterning into a predetermined shape is made to provide on the first insulating film 106; and the first interconnect trench 42a is obtained upon gradually etching the first insulating film 106.

Next, by a sputtering method or a reactive sputtering method, a tantalum containing barrier metal film 24a (film thickness of Ta is about 20 nm, film thickness of TaN is about 10 nm) in a state where Ta and TaN are formed is formed on the whole surface of the first insulating film 106.

Successively, a configuration shown in FIG. 5A while forming a first seed metal film 70 including Cu element for growing copper plating and Al element to be the different metal element is obtained on the tantalum containing barrier metal film 24a using the sputtering method or the reactive sputtering method.

Figure 5B:
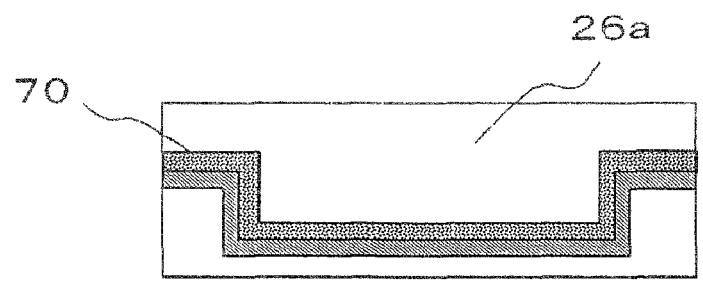

Successively, as shown in FIG. 5B, a copper containing metal film 26a is formed on the first seed metal film 70a. The copper containing metal film 26a is formed by an electroplating method such that a film thickness of the flat portion of the copper containing metal film 26a becomes about 600 nm, while dipping the substrate into aqueous copper sulfate solution with solution temperature about 25° C.

Figure 5C:
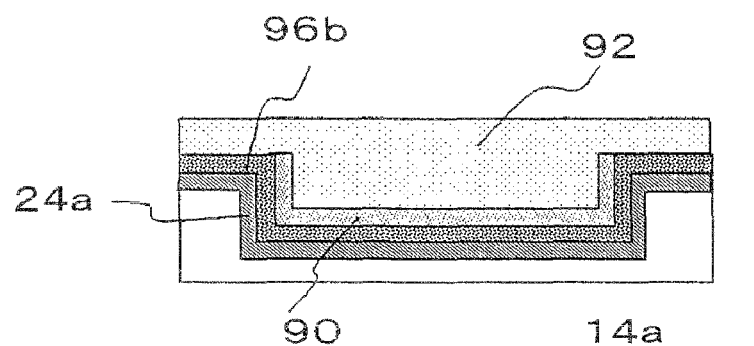

As shown in FIG. 5C, with respect to the substrate applying the plating as above, an annealing is made to carry out during degree of 30 minutes at 350° C. By carrying out the annealing with such high temperature, Al to be the different metal element is distributed by the thermal diffusion into the copper containing metal film 26a from the first seed metal film 70, owing to this, the stress migration is suppressed, so that the voids are hardly generated. Specifically, a region vicinity in which the first seed metal film 70 resides becomes the different metal high concentration region 96b, the different metal intermediate concentration region 90 is formed in the neighborhood of it, and the different metal low concentration region 92 is formed at a distant region from the first seed metal film 70.

By such heat treatment, since the different metal high concentration region 96b is formed in the vicinity of the bottom face and the side face of the first interconnect 22a, it is possible to fasten the first interconnect 22a from a peripheral portion thereof so that it is possible to suppress the shrinkage of the copper containing metal film of the first interconnect 22a. Owing to this, it is possible to suppress the stress migration of the first interconnect 22a as a whole.

Further, by carrying out such heat treatment, there is generated an effect that a resistance value of the first copper interconnect becomes lower than that before annealing. The annealing may be carried out for instance, not less than 200° C. and not more than 500° C.

Figure 5D:
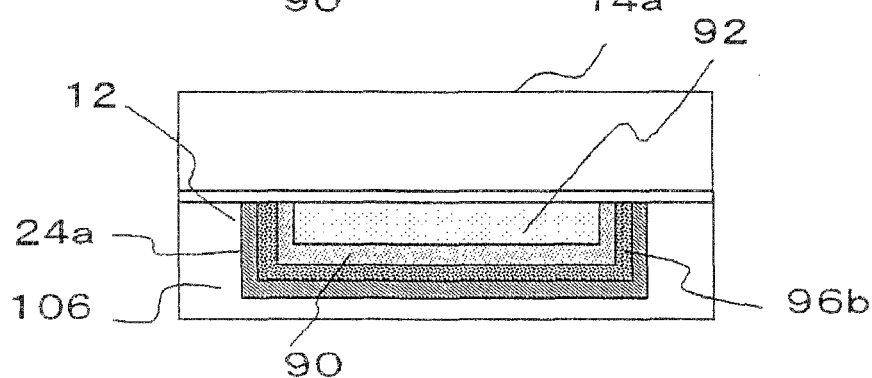

Next, as shown in FIG. 5D, an unnecessary copper containing metal film and tantalum containing barrier metal film 24a formed outside the interconnect trench are removed by Chemical Mechanical Polishing (CMP), so that the first copper interconnect is made to form in such a way that the copper containing metal film remains inside the interconnect trench only.

Immediately after the CMP treatment of the copper containing metal film and the like, an anticorrosion treatment for treating a surface of the copper containing metal film with BTA to be anticorrosive is performed. Here, 0.05% BTA solution is used. Owing to this, after a CMP treatment, when also moving a specimen for shift to next process, the copper containing metal film surface is protected by the BTA, therefore, it is possible to prevent that the copper containing metal film is oxidized.

Thereafter, as shown in FIG. 5D, an insulating film 14a (film thickness is about 350 nm) composed of the SiCN film 12 (film thickness is about 70 nm), and a silicon oxide film are formed.

Figure 5E:
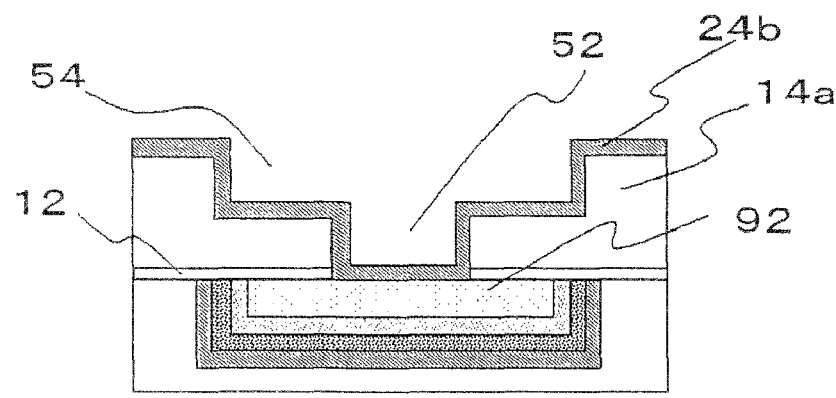

Successively, as shown in FIG. 5E, the insulating film 14a composed of the silicone oxide film is made to perform etching as long as the SiCN film 12 is exposed using a lithography technique. Thereafter, an upper face of the copper containing metal film included in the first interconnect is exposed by carrying out an etching of the SiCN film 12 in such a way as to change etching gas. Owing to this, a connection hole 52 is formed. Thereafter, a tantalum containing barrier metal film 24b is formed in such a way as to embed an inside portion of the connection hole 52.

Figure 6F:
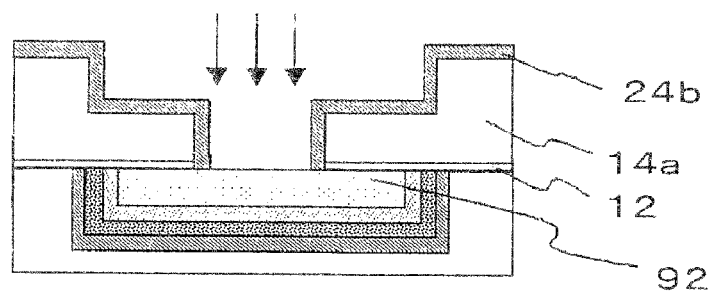
FIGS. 6F to 6J are sectional views showing a method for manufacturing an interconnect structure of the copper containing metal interconnect in the semiconductor device.

Next, as shown in FIG. 6F, the barrier metal film 24b residing on the bottom of the connection hole is removed, upon carrying out a sputter etching (a direction of the sputter etching is illustrated in the drawing) while using $Ar^+$ and the like.

At this time, when forming the tantalum containing barrier metal film 24b, it may be used devices in such a way as to combine a directional sputtering apparatus such as a long distance sputtering apparatus or a general ionization sputtering apparatus with an etching back apparatus.

That is, after forming the tantalum containing barrier metal film 24b by the directional sputtering apparatus, the barrier metal film 24b formed on the bottom of the connection hole (concave portion) 52 is made to selectively carry out an anisotropic etching by the etching back apparatus, owing to this, it is possible to remove the barrier metal film 24b.

This way, the tantalum containing barrier metal film 24b remains on an inner face of the connection hole 52 and the second interconnect trench side wall and the like; and it is possible to remove the tantalum containing barrier metal film 24b on the bottom of the connection hole 52.

Figure 6G:
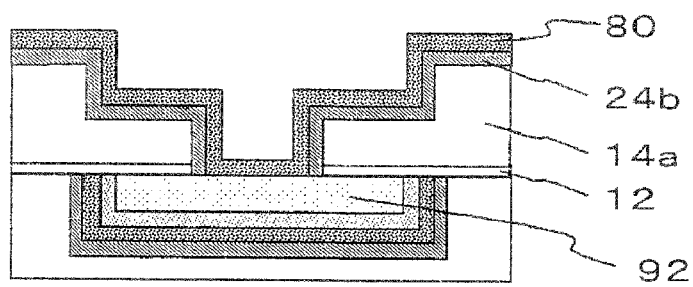

Successively, a second seed metal film 80 including Cu element for growing a copper plating and Al element to be the different metal element is formed on the surfaces of the tantalum containing barrier metal film 24b and the exposed first interconnect by the sputtering method or the reactive sputtering method, thus a structure shown in FIG. 6G is obtained.

Figure 6H:
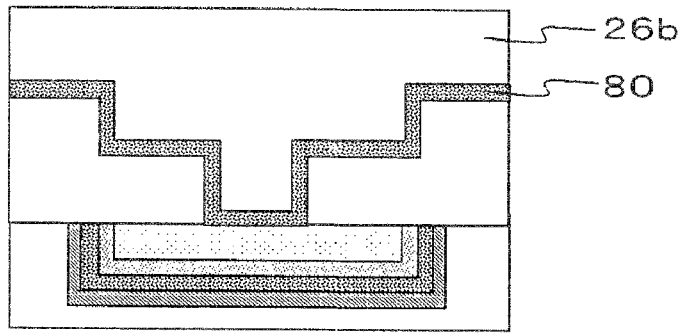
Figure 6I:
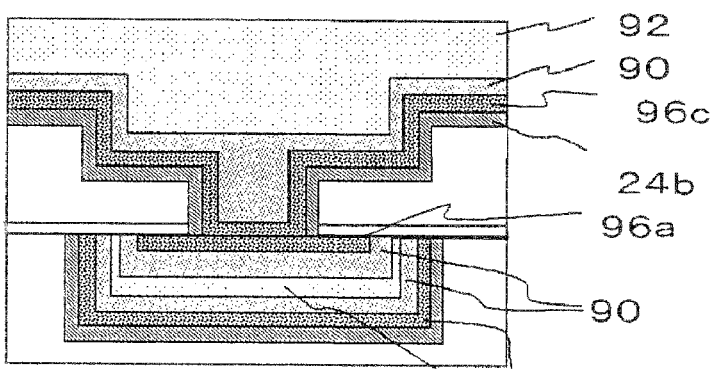

Successively, as shown in FIG. 6H, a copper containing metal film 26b is formed on the second seed metal film 80. The copper containing metal film 26b is formed by the electroplating method such that a film thickness of the flat portion of the copper containing metal film 26b becomes about 600 nm while dipping the substrate into aqueous copper sulfate solution of solution temperature about 25° C.

About the substrate applied the plating as described above, as shown in FIG. 6I, an annealing is performed during degree of 30 minutes at 350° C. By performing the annealing with such high temperature, Al to be the different metal element is thermally diffused into the copper containing metal film 26b from the second seed metal 80, therefore, the stress migration is suppressed, owing to this, a Cu element pull up phenomenon from the first interconnect via the connection plug is suppressed. For that reason, in the interface vicinity between the first interconnect and the connection plug, voids are hardly generated.

Specifically, the region vicinity where the second seed metal film 80 resides becomes a different metal high concentration region 96c, in its periphery, the different metal intermediate concentration region 90 is formed, and the different metal low concentration region 92 is formed at a region away from the second seed metal film 80.

Further, by performing such heat treatment, an effect is generated that resistance value of the second copper interconnect 22b decreases in comparison with that before annealing. It should be noted that this annealing capable of being performed, foe instance, at not less than 200° C. and not more than 500° C.

Figure 6J:
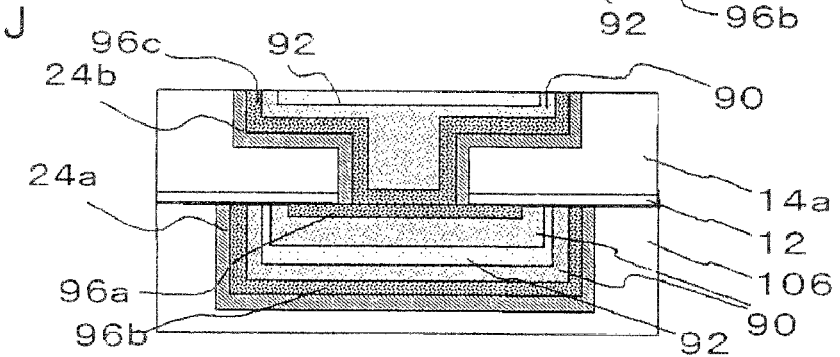

Next, as shown in FIG. 6J, a second copper interconnect is formed in such a way that copper containing metal film or the like remains only on inner portion of interconnect trench, while removing an unnecessary copper containing metal film and tantalum containing barrier metal film 24b formed outside the interconnect trench by the Chemical Mechanical Polishing.

As described above, the dual damascene interconnect structure shown in FIG. 6J is formed. Thereafter, by repeating the process described above, it is possible to form the semiconductor device with multi-layer interconnect structure more than three layers as shown in FIG. 1.

Fifth Embodiment

There will be described a method for manufacturing the semiconductor device in case of single damascene in the present embodiment.

Figure 7A:
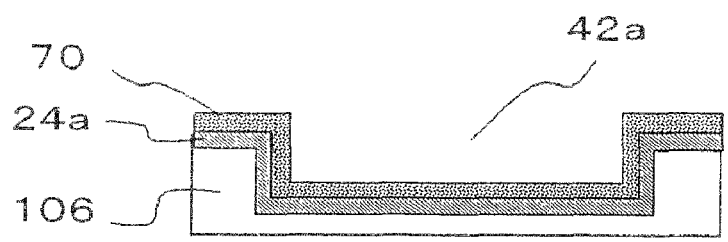
FIGS. 7A to 7E are sectional views showing a method for manufacturing an interconnect structure of the copper containing metal interconnect in the semiconductor device.

FIG. 7A shows a structure in which the interconnect trench is formed on the first insulating film 106. In order to form this structure, first, the first insulating film 106 is formed over the substrate (not shown in the drawings), after that, a resist film (not shown in the drawings) being subjected to patterning into predetermined shape is provided on the first insulating film 106; and the first interconnect trench 42a is obtained, while gradually etching the first insulating film 106.

Next, by using the sputtering method or the reactive sputtering method, a tantalum containing barrier metal film 24a (film thickness of Ta is about 20 nm, film thickness of TaN is about 10 nm) where Ta and TaN are formed on the entire surface of the first insulating film 106 is formed.

Successively, by using the sputtering method or the reactive sputtering method, the first seed metal film 70 including Cu element for growing a copper plating and Al element to be the different metal element is formed on the tantalum containing barrier metal film 24a, thus a structure shown in FIG. 7A is obtained.

Figure 7B:
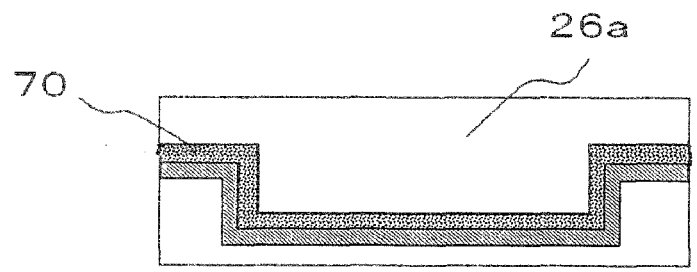

Successively, as shown in FIG. 7B, the copper containing metal film 26a is formed on the first seed metal 70. The copper containing metal film 26a is formed by the electroplating method in such a way that a film thickness of the flat portion of the copper containing metal film 26a becomes about 600 nm, while dipping the substrate into aqueous copper sulfate solution with solution temperature about 25° C.

Figure 7C:
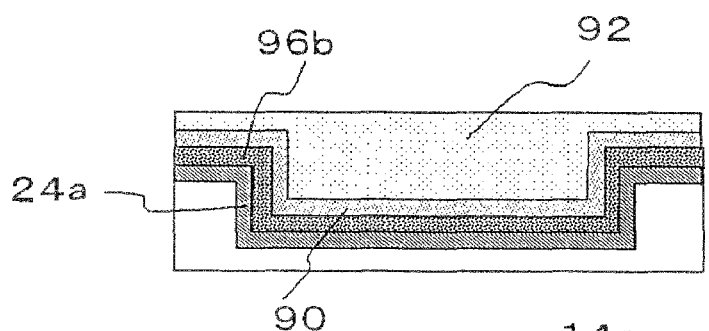

As shown in FIG. 7C, about the substrate applied the plating in such a way as above, an annealing is carried out during degree of 30 minutes at 350° C. By carrying out the annealing with such high temperature, Al to be the different metal element is thermally diffused into the copper containing metal film 26a from the first seed metal film 70, owing to this, the stress migration is suppressed, thus the voids are hardly generated. Specifically, a region vicinity where the first seed metal film 70 resides becomes the different metal high concentration region 96b, at periphery thereof, the different metal intermediate concentration region 90 is formed, and the different metal low concentration region 92 is formed on a region away from the first seed metal film 70.

Due to such heat treatment, the different metal high concentration region 96b is formed in the vicinity of the bottom face and the side face of the first interconnect 22a, owing to this, the first interconnect 22a is capable of being fixed from a peripheral portion thereof, so that it is possible to suppress a shrinkage of the copper containing metal film of the first interconnect 22a.

For this reason, it is possible to suppress the stress migration of the first interconnect as a whole; and it is possible to improve the manufacturing stability of the semiconductor device provided with the copper containing metal interconnect.

Further, by carrying out such heat treatment, an effect is produced that resistance value of the first copper interconnect 22a decreases in comparison with that before annealing. It should be noted that this annealing can be carried out, for instance, with not less than 200° C. and not more than 500° C.

Figure 7D:
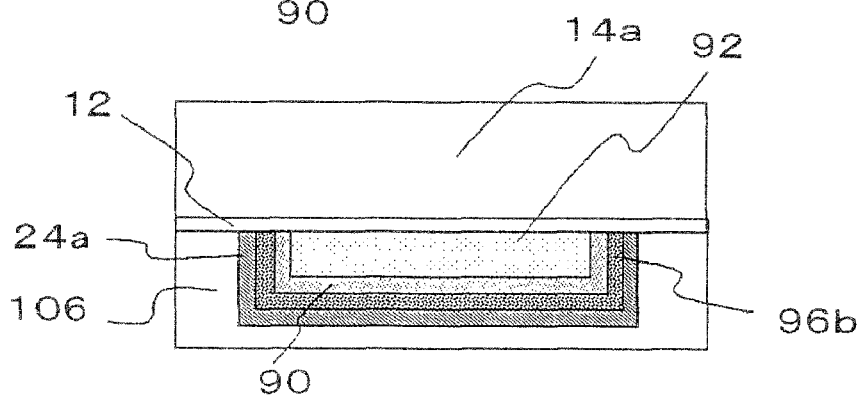

Next, as shown in FIG. 7D, the first copper interconnect is formed such that the copper containing film or the like remains on only inside the interconnect trench, while removing an unnecessary copper containing metal film and the tantalum containing barrier metal film 24a formed outside the interconnect trench by the Chemical Mechanical Polishing (CMP).

Thereafter, as shown in FIG. 7D, the insulating film 14a (film thickness is about 350 nm) composed of a SiCN film 12 (film thickness is about 70 nm) and the silicon oxide film is formed.

Figure 7E:
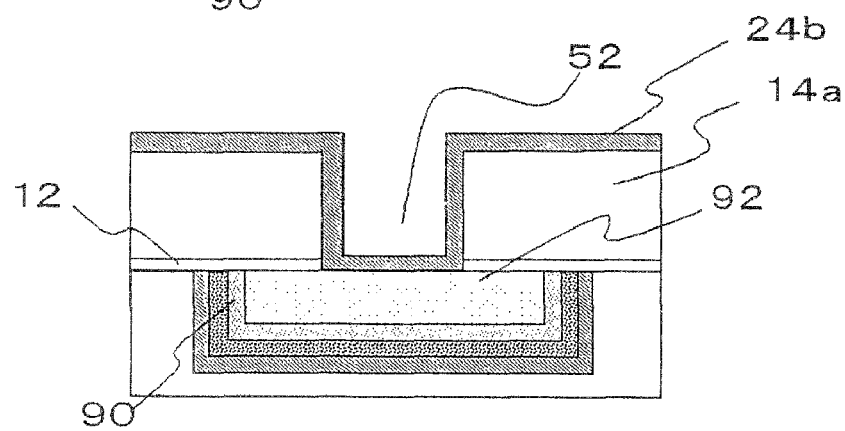

Successively, as shown in FIG. 7E, by using the lithography technique, the insulating film 14a composed of the silicon oxide film is made to etch up to the SiCN film 12 being exposed. Thereafter, the upper face of the copper containing metal film included in the first interconnect is exposed, upon etching the SiCN film 12 while changing the etching gas. Owing to this, the connection hole 52 is formed. Thereafter, the tantalum containing barrier metal film 24b is formed in such a way as to embed inside the connection hole 52.

Figure 8F:
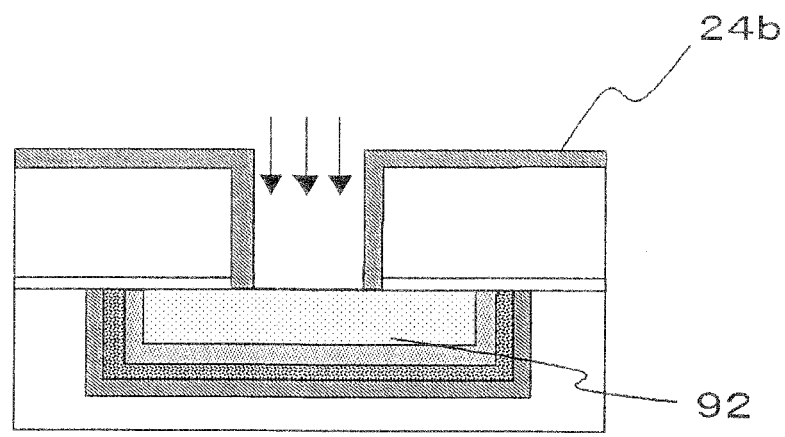
FIGS. 8F to 8H are sectional views showing a method for manufacturing an interconnect structure of the copper containing metal interconnect in the semiconductor device.

Next, as shown in FIG. 8F, the barrier metal film 24b residing on the bottom of the connection hole is removed, upon carrying out sputtering etching (a sputtering etching direction is illustrated) using $Ar^+$ and the like.

At this time, when forming the tantalum containing barrier metal film 24b, the directional sputtering apparatus such as the long distance sputtering apparatus or the general ionization sputtering apparatus may be combined with the etching back apparatus to use.

That is, after forming the tantalum containing barrier metal film 24b by the directional sputtering apparatus, the barrier metal film 24b formed on the bottom of the connection hole (concave portion) 52 can be removed upon selectively carrying out an anisotropic etching of the barrier metal film 24b by the etching back apparatus.

Thus, it causes the tantalum containing barrier metal film 24b to remain inside the connection hole 52; and it is possible to remove the tantalum containing barrier metal film 24b on the bottom of the connection hole 52.

Figure 8G:
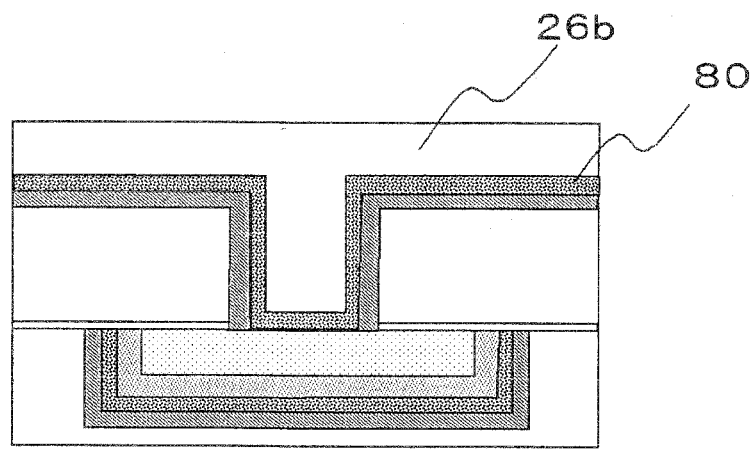

Successively, by using the sputtering method or the reactive sputtering method, the second seed metal film 80 including Cu elements for growing a copper plating and Al elements to be the different metal elements is formed on the tantalum containing barrier metal film 24b and the exposed surface of first interconnect, thus structures shown in FIG. 8G is obtained.

Successively, as shown in FIG. 8G, the copper containing metal film 26b is formed on the second seed metal film 80. The copper containing metal film 26b is formed with the electroplating technique such that a film thickness of the flat portion of the copper containing metal film 26b becomes about 200 nm, while dipping the substrate into aqueous copper sulfate solution with solution temperature is about 25° C.

Figure 8H:
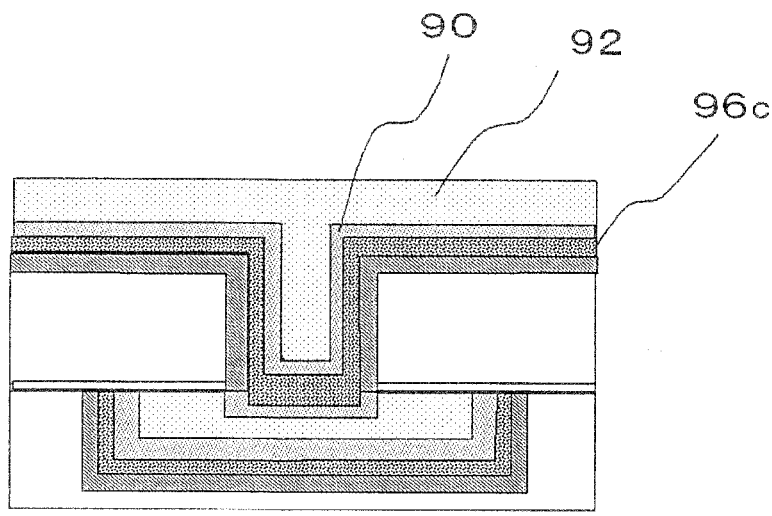

As shown in FIG. 8H, about the substrate applied plating in such a way as above, an annealing is carried out during degree of 30 minutes at 3500C. By carrying out the annealing with such high temperature, Al to be the different metal element is thermally diffused into the copper containing metal film 26b from the second seed metal film 80, owing to this, the stress migration is suppressed, thus the Cu elements pull up phenomenon from the first interconnect via the connection plug is suppressed. For this reason, in the interface vicinity between the first interconnect and the connection plug, voids are hardly produced.

Specifically, the region vicinity where the second seed metal film 80 resides becomes a different metal high concentration region 96c, at periphery thereof, the different metal intermediate concentration region 90 is formed, and the different metal low concentration region 92 is formed at a region away from the second seed metal film 80.

Further, by carrying out such heat treatment, an effect that a resistance value of the connection hole decreases in comparison with that before annealing is also generated. This annealing can be carried out, for instance, with not less than 200° C. and not more than 500° C.

Figure 9I:
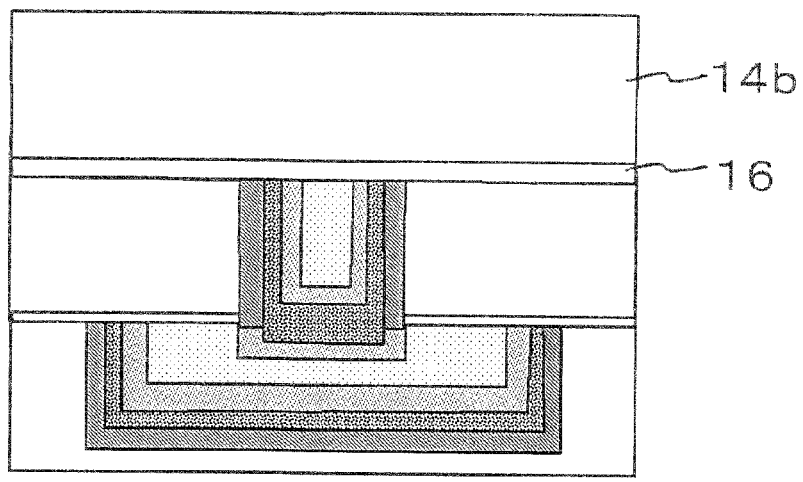
FIGS. 9I and 9J are sectional views showing a method for manufacturing an interconnect structure of the copper containing metal interconnect in the semiconductor device.

Next, as shown in FIG. 9I, the second copper interconnect is formed in such a way that the copper containing metal film or the like is made to remain only inside the interconnect grove, while removing an unnecessary copper containing metal film and the tantalum containing barrier metal film 24b formed outside the interconnect trench by the Chemical Mechanical Polishing.

Thereafter, as shown in FIG. 9I, the insulating film 14b (film thickness is about 350 nm), which is composed of SiCN film 16 (film thickness is about 70 nm) and the silicon oxide film is formed.

Figure 9J:
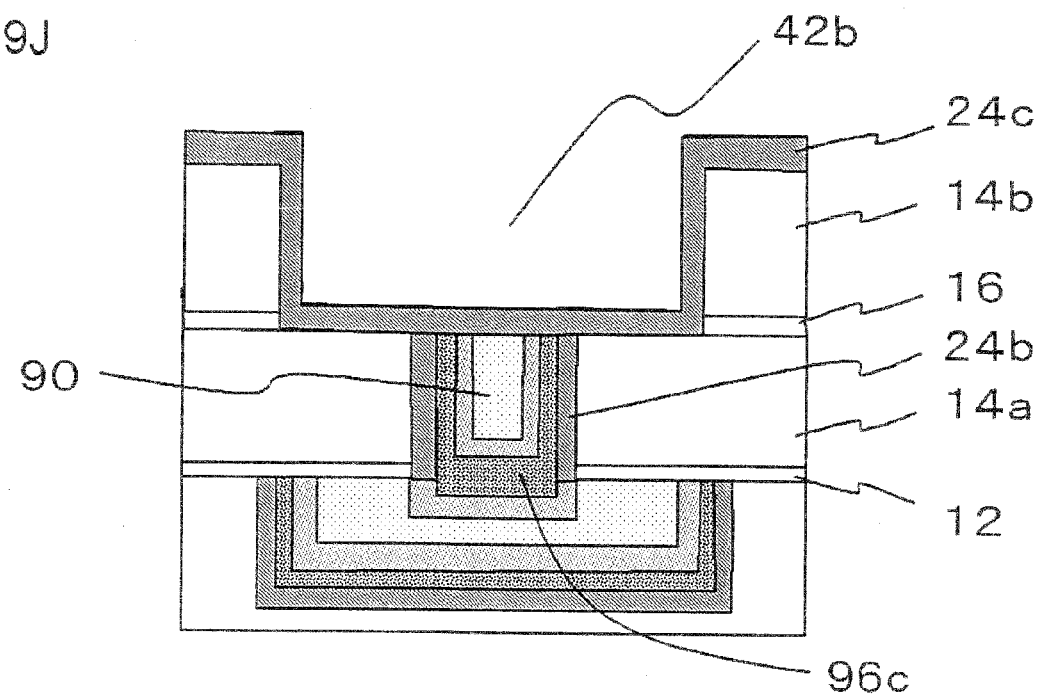

Successively, as shown in FIG. 9J, by using the lithography technique, the insulating film 14b composed of the silicon oxide film is etched until the SiCN film 16 being exposed. Thereafter, an upper face of the copper containing metal film included in the connection hole is exposed, by etching the SiCN film 16 with etching gas changed. Owing to this, the second interconnect trench 42b is formed. Thereafter, the tantalum containing barrier metal film 24b is formed in such a way as to embed inside the connection hole 42b.

Successively, by using the sputtering method or the reactive sputtering method, the second seed metal film 88 including Cu elements for growing copper plating and Al elements to be the different metal elements is formed on the surface of a tantalum containing barrier metal film 24c.

Figure 10K:
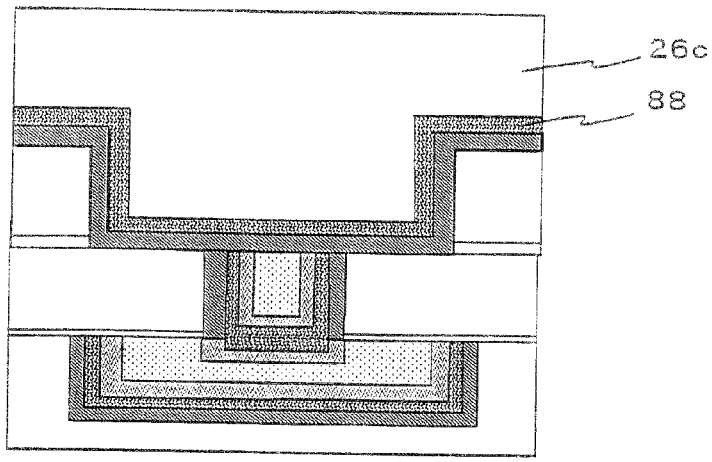
FIGS. 10K to 10M are sectional views showing a method for manufacturing an interconnect structure of the copper containing metal interconnect in the semiconductor device.

And, as shown in FIG. 10K, a copper containing metal film 26c is formed on the second seed metal film 88. The copper containing metal film 26c is formed by the electroplating method such that the film thickness of the flat portion of the copper containing metal film 26c becomes about 600 nm, while dipping the substrate into the aqueous copper sulfate solution with solution temperature be about 25° C.

Figure 10L:
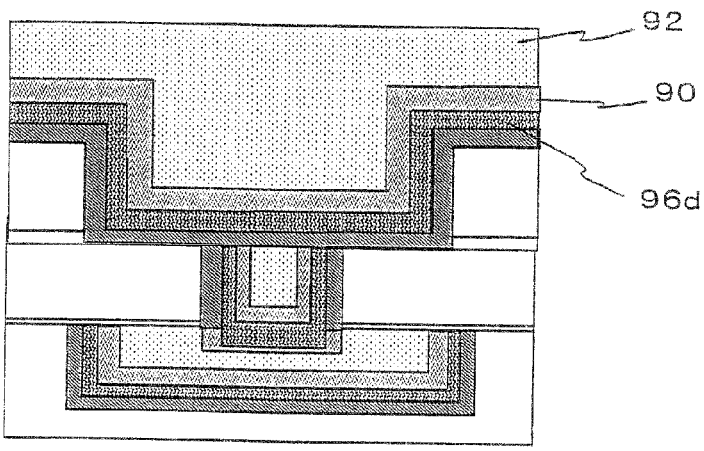

As shown in FIG. 10L, about the substrate to which the plating is applied in such a way as above, an annealing is carried out during degree of 30 minutes at 3500C. By carrying out the annealing with such high temperature, the Al to be the different metal element is thermally diffused into the copper containing metal film 26c from the second seed metal film 88, owing to this, the stress migration is suppressed, so that Cu elements pull up phenomenon from the first interconnect via the connection plug is suppressed. For that reason, in the interface vicinity between the first interconnect and the connection plug, the voids are hardly generated.

Specifically, the region vicinity where the second seed metal film 88 resides becomes a different metal high concentration region 96d, at periphery thereof, the different metal intermediate concentration region 90 is formed, and the different metal low concentration region 92 is formed at a region away from the second seed metal film 88.

Further, by carrying out such heat treatment, an effect that resistance value of the connection hole decreases in comparison with that before annealing is generated. It should be noted that this annealing is capable of being carried out, for instance, at not less than 200° C. and not more than 500° C.

Figure 10M:
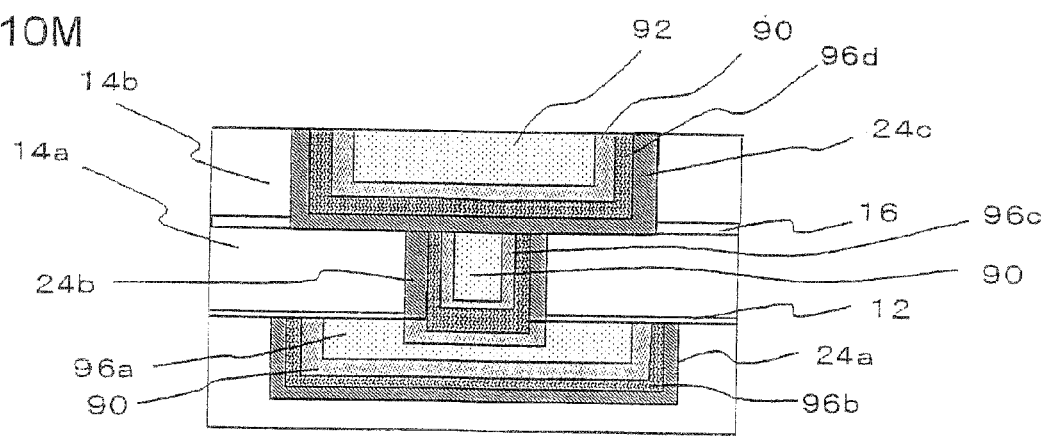

Next, as shown in FIG. 10M, the second copper interconnect is formed such that the copper containing metal film or the like remains only inside the interconnect trench, while causing an unnecessary copper containing metal film and a tantalum containing barrier metal film 24c formed outside the interconnect trench to remove by the Chemical Mechanical Polishing.

In such a way as above, the single damascene interconnect structure shown in FIG. 10M is formed. Thereafter, by repeating the process described above, it is possible to form the semiconductor device of multi-layer interconnect structure more than three layers as shown in FIG. 1.

Sixth Embodiment

There will be described a distribution state of the different metal elements in the above-described embodiments below.

In the manufacturing method described above, about the case where Sn is used as the different metal element, a following model experiment is carried out to investigate the distribution state of Sn elements within the copper containing metal interconnect.

Figure 11A:
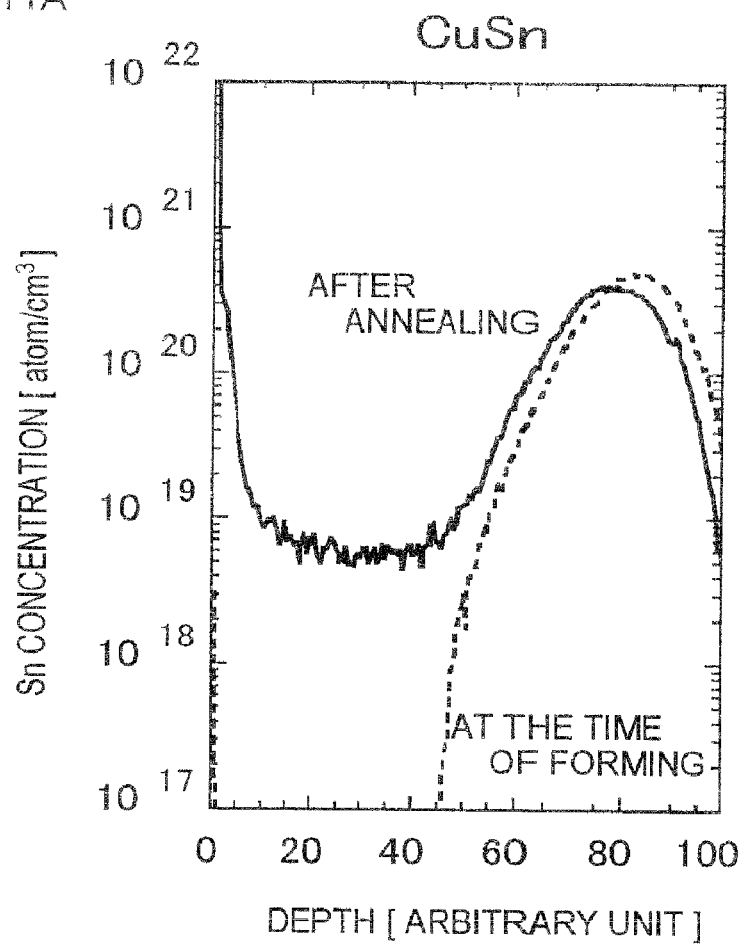
FIGS. 11A and 11B are a graphical representation and an experiment diagram respectively showing a model experiment result concerning distribution of different metal concentration in the copper containing metal interconnect provided for a portion of interconnect structure in the semiconductor device.
Figure 11B:
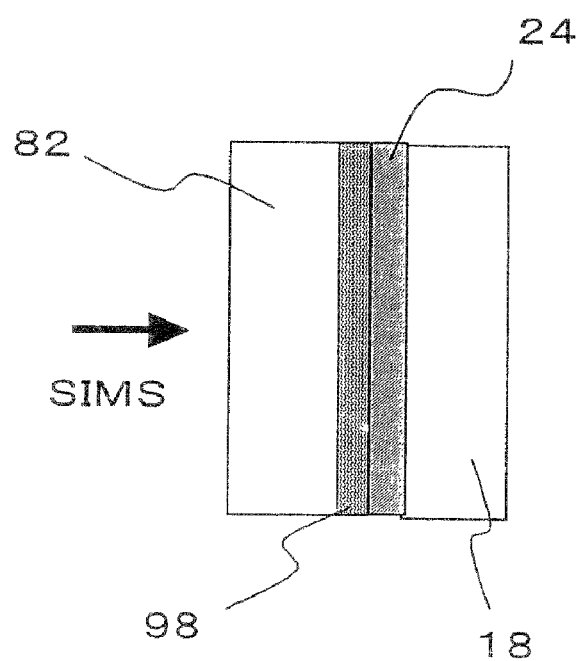

FIGS. 11A and 11B are a graphical representation and an experiment view respectively showing the model experiment result concerning the distribution of the different metal concentration in the copper containing metal interconnect provided for a portion of interconnect structure in the semiconductor device. FIG. 11A is the graphical representation showing a result of the model experiment shown in FIG. 11B about the distribution of the different metal concentration within a copper containing metal interconnect. Further, FIG. 11B is a conceptual view explaining a method of the above described model experiment.

In FIG. 11B, the distribution of the different metal concentration in the copper containing metal interconnect is measured with a secondary ion mass spectrometry (SIMS). Here, the secondary ion mass spectrometry (SIMS) is a technique for investigating an in-phase distribution of elements or a depth direction distribution of elements included in various materials, such as semiconductor, dielectrics, or the like.

First, in order to prepare measured sample, the tantalum containing barrier metal film 24 is formed on an insulating film 18 composed of $SiO_2$ and the like. Next, a seed metal film 98 composed of the copper containing metal film including Sn element such as CuSn alloy and the like is formed on the tantalum containing barrier metal film 24 composed of Ta/TaN and the like; and further, a copper plating film 82 is formed on the seed metal film 98. And, a measured sample shown in FIG. 11B in a state where the seed metal film and the copper plating film are heated to carry out the annealing is obtained.

As for this measured sample, a SIMS analysis is carried out; and a Sn element distribution as shown in FIG. 11A is obtained. From this measurement result, it is found that the different metal elements Sn are diffused in a plated copper due to the annealing.

Thus, it is possible to easily diffuse the different metal elements such as Sn element and like into the copper plating film, upon carrying out the annealing of the seed metal film including the different metal element and the copper element, and the copper plating film. Owing to this, such a method where the seed metal film and the copper plating film are formed followed by carrying out the annealing is capable of being employed for the method for manufacturing the semiconductor device of the present embodiment.

Further, in the manufacturing method described above description, about the case using Sn as the different metal element, in order to investigate the distribution state within the copper containing metal interconnect of the Sn element, a following survey is performed.

It should be noted that the different metal element within the copper containing metal film is capable of being measured using an Energy Dispersive X-ray Fluorescene Analyzer (EDX).

By a result from the EDX analysis and the like, if the concentration of the different metal elements in the interface vicinity between the first interconnect and the connection plug within the first interconnect is higher than the concentration of the different metal elements in the center portion of the first interconnect, in this interface vicinity, the stress migration is effectively suppressed. Further, in another region within the first interconnect, a favorable conductivity is maintained.

Further, by a result from the EDX analysis and the like, if the concentration of the different metal elements in the interface vicinity between the first interconnect and the connection plug within the first interconnect is not less than 0.01 atom %, in this interface vicinity, the stress migration is effectively suppressed. Further, if the concentration is not more than 10 atom %, in this interface vicinity, it is possible to suppress the decrease of the conductivity.

Further, by a result from the EDX analysis and the like, if the concentration of the different metal elements in the vicinity of the bottom face or the side face of the first interconnect is higher than the concentration of the different metal elements in the center portion of the first interconnect, in the vicinity of the bottom face or the side face, the stress migration is effectively suppressed.

Further, by a result from the EDX analysis and the like, if the concentration of the different metal elements in the vicinity of the bottom face or the side face of the first interconnect is not less than 0.01 atom %, in the vicinity of the bottom face or the side face, the stress migration is effectively suppressed. Further, if the concentration is not more than 10 atom %, in the vicinity of the bottom face or the side face, it is possible to suppress the decrease of the conductivity.

Seventh Embodiment

There will be described a manufacturing apparatus in the above described embodiment below.

In the present invention, a process for removing a barrier metal film of the bottom of the connection hole may include a process for removing the barrier metal film by sputtering etching method using $Ar^+$, which puts into practice the bias sputtering method applying the bias to the semiconductor substrate.

It is possible to maintain the barrier metal film residing on the sidewall of the connection hole in the state with little damage, upon selectively removing the barrier metal film residing on the bottom of a predetermined connection hole by removing the barrier metal film on the bottom of the connection hole using the sputtering etching method using $Ar^+$ that applies such bias sputtering method.

Figure 12A:
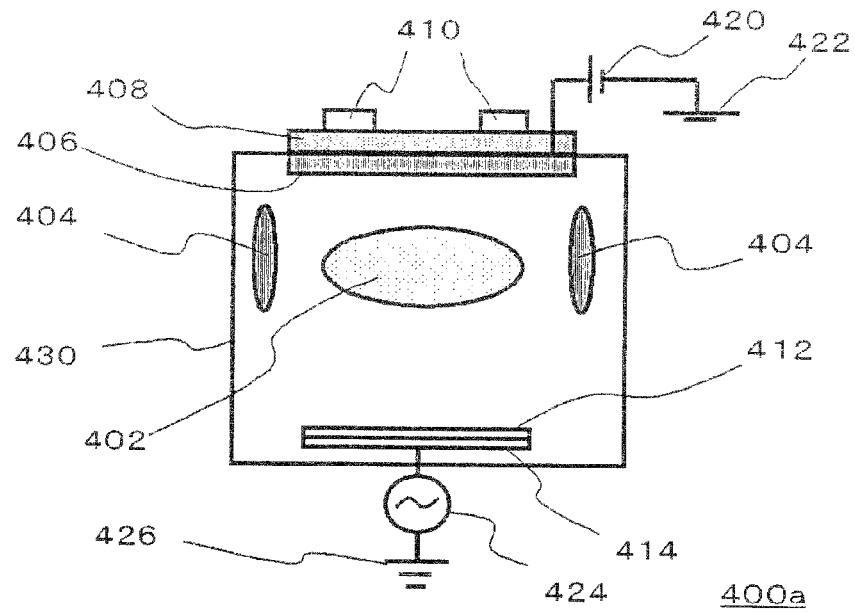
FIGS. 12A and 12B are sectional views showing a constitution of the semiconductor device used for a method for manufacturing the interconnect structure of the copper containing metal interconnect in the semiconductor device.
Figure 12B:
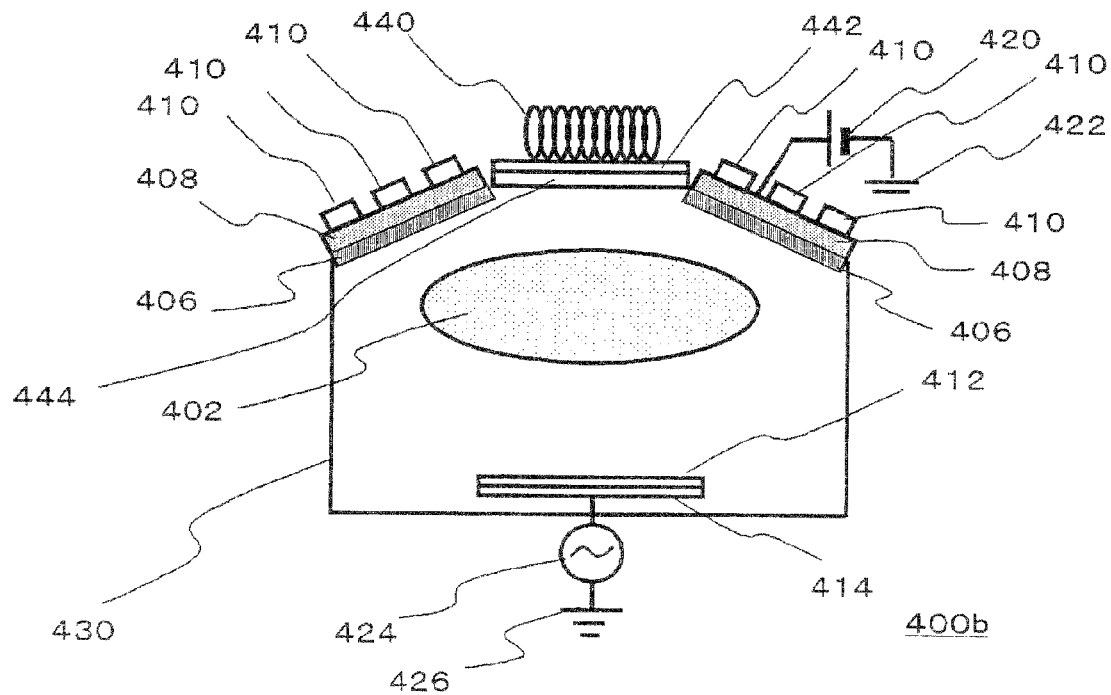

FIGS. 12A and 12B are sectional views showing a structure of manufacturing apparatus used for the method for manufacturing the interconnect structure of the copper containing metal interconnect in the semiconductor device. FIG. 12A is a sectional view of the sputtering apparatus provided with a RF coil within its chamber. FIG. 12B is a sectional view of the sputtering apparatus provided with the RF coil on outside of the chamber. In the manufacturing process of the semiconductor device in the present embodiment, both types of the sputtering apparatus may be used to remove the barrier metal film on the bottom of the connection plug.

A sputtering apparatus 400a shown in FIG. 12A is provided with a supporting stand 414 for putting a wafer 412 inside a chamber 430. One electrode of an AC voltage applying apparatus 424 is connected to the supporting stand 414 such that a bias application is capable of being carried out; and an opposite side electrode is connected to a grounding portion.

A ring shaped RF coil 404 is provided at a periphery of a generation portion of plasma 402 in the chamber 430; and target keeping portion 408 for keeping a target 406 is provided on the upper portion of the chamber 430. A magnetic force applying apparatus 410 is connected to the target keeping portion 408. Further, there is provided a DC voltage applying apparatus 420 so that it is possible to apply the DC voltage to the target keeping portion 408, and a grounding portion 422 connected thereto.

According to such apparatus, in the same apparatus as an apparatus used for a process for forming the barrier metal film, it is possible to remove the barrier metal film on the bottom of the connection hole with Ar$^+$ etching or the like, owing to this, it is possible to reduce remarkably a manufacturing cost of the semiconductor device of the present embodiment, and to improve a manufacturing stability. Because, such device is provided with both two functions of the sputtering chamber and the RF etching chamber.

Further, a sputtering apparatus 400b shown in FIG. 12B is provided with the supporting stand 414 for putting the wafer 412 inside the chamber 430. One electrode of the AC voltage applying apparatus 424 is connected to the supporting stand 414 such that a bias application is capable of being carried out; and an opposite side electrode is connected to a grounding portion.

There is provided a RF coil 440 at outside of the chamber above a generation portion of plasma 402 within the chamber 430; and there is provided an RF coil keeping portion 442 and a bulkhead 444, which blocks particles being subjected to sputtering however RF application is not interrupted at lower portion of the RF coil 440 at upper portion inside the chamber. Further, at periphery of the bulkhead 444, the ring shaped target keeping portion 408 to keep a ring shaped target 406 is provided. A magnetic force applying apparatus 410 is connected to the target keeping portion 408. Further, there is also provided a DC voltage applying apparatus 420 such that it is possible to apply a DC voltage to the target keeping portion, and a grounding portion 422 for connecting thereto.

According to such apparatus, within the same apparatus as an apparatus used for a process for forming the barrier metal film, it is possible to remove the barrier metal film on the bottom of the connection hole with Ar$^+$ etching or the like, owing to this, it is possible to reduce remarkably the manufacturing cost of the semiconductor device of the present embodiment, and to improve the manufacturing stability. This is the reason that such device provided with both two functions of the sputtering chamber and the RF etching chamber.

There will be described an apparatus operation, when removing the barrier metal film at the bottom of the connection plug of the semiconductor device of the present embodiment, while taking an apparatus, which is provided with a RF coil at outside of the chamber, for instance, an i-PVD manufactured by TEL company shown in FIG. 12B.

First, in a step (forming step) for forming the tantalum containing barrier metal film on an inner wall of the connection hole, there is formed the barrier metal film in such a way that every bias applied to the DC voltage application apparatus, an ICP coil (RF coil), and the supporting stand, while making the bias turned ON. On this occasion, a pressure inside the chamber is made to set into degree of 20 mTorr.

Next, in a step (etching step) for removing a barrier metal on the bottom of the connection plug by the etching using Ar$^+$ and the like, the barrier metal film is removed while performing etching with Ar$^+$ and the like in a state where the DC application apparatus is turned OFF, and the bias applied to the ICP coil (RF coil) and the supporting stand is turned ON. On this occasion, a pressure inside the chamber is made to set into degree of 1 mTorr.

According to this semiconductor manufacturing apparatus, it is possible to appropriately control a film thickness of the barrier metal film, and it is possible to selectively remove the predetermined barrier metal on the bottom of the connection hole, owing to this, it is possible to suppress a resistance increase rate of the semiconductor device. In the successive chamber, on the surface of the first interconnect thus exposed, the seed metal film including copper elements and the different metal element is formed, upon being performed the annealing later, it is possible to form the high concentration region of the different metal element in the interface vicinity between the first interconnect and the connection hole, thus it is possible to improve the stress migration resistance of the first interconnect composed of the copper containing metal film.

Further, by carrying out forming the barrier metal film with the condition described above, and removing the barrier metal film on the bottom of the connection plug, while using such apparatus, it becomes possible to conduct both processes inside the same chamber, that has hitherto been difficult. As a result, it is possible to decrease the manufacturing cost of the semiconductor device of the present embodiment, and to enhance the manufacturing stability.

Eighth Embodiment

In the above described embodiment, there will be described a method for manufacturing the semiconductor device according to the dual damascene process forming no barrier metal film on the bottom of the connection hole.

FIGS. 16A to 16D are, in the present embodiment, sectional views showing the method for manufacturing the semiconductor device according to the dual damascene process forming no barrier metal film on the bottom of the connection hole. By using FIGS. 16A to 16D, there will be described in detail, in the method for manufacturing the semiconductor devices until a process forming the second interconnect copper plating film by the dual damascene process from a process removing the barrier metal film on the bottom of the connection hole, in the present invention.

Figure 16A:
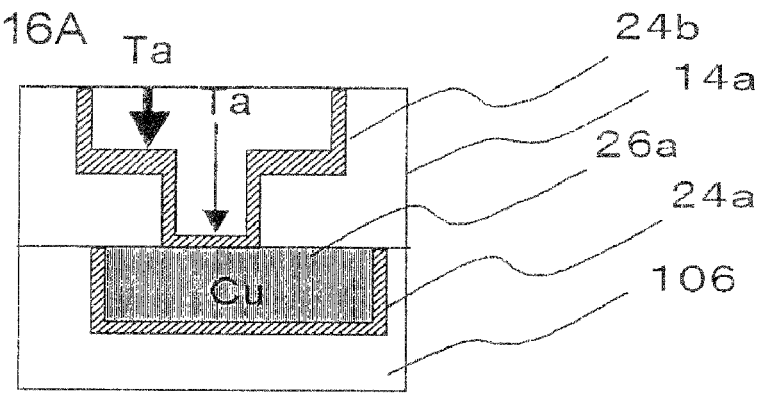
FIGS. 16A to 16D are sectional views showing a method for manufacturing the semiconductor device according to dual damascene process without forming a barrier metal film at the bottom of the connection hole in the present invention.
Figure 16B:
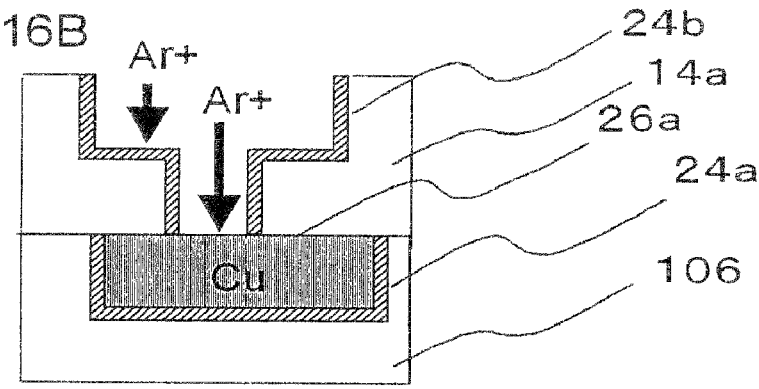

As shown in FIGS. 16A and 16B, in the case using the above described device, it is possible to perform, inside the same chamber, forming the tantalum containing barrier metal film 24b, and removing the tantalum containing barrier metal film 24b residing on the bottom of the connection hole by the Ar$^+$ plasma.

Figure 16C:
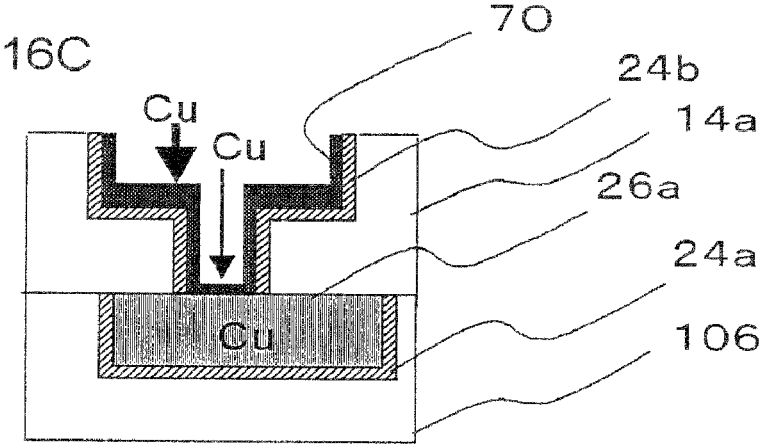

Next, as shown in FIG. 16C, in another chamber, a seed metal film 70 including the copper elements and the different metal elements is formed on the exposed surface of the first interconnect 26a and the tantalum containing barrier metal film 24b.

Figure 16D:
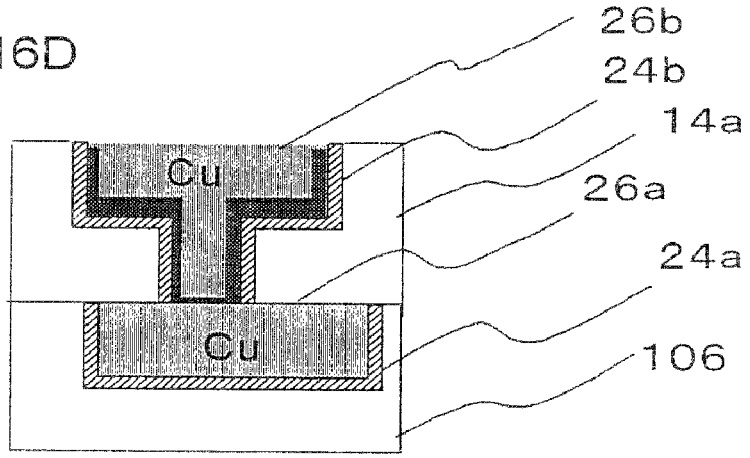

And, as shown in FIG. 16D, the second interconnect 26b is formed on the seed metal 70 in such a way as to perform copper plating so as to embed the second interconnect trench and the connection hole, followed by performing the annealing.

Here, in the conventional sputtering chamber, it was difficult, inside the same chamber, to perform both the forming the tantalum containing barrier metal film 24b and the removing the tantalum containing barrier metal film 24b due by the Ar$^+$ plasma.

For that reason, in order to remove the tantalum containing barrier metal film 24b residing on the bottom of the connection hole by the Ar+ plasma, it is necessary for that conventional method to establish another dedicated chamber, so that there was still room for further improvement in aspect that the manufacturing cost of the semiconductor device becomes high.

On the contrary, in the present embodiment, since using the above described apparatus, it is not necessary to establish dedicated chamber for performing removing the tantalum containing barrier metal film 24b, owing to this, it is possible to decrease the manufacturing cost of the semiconductor device and to enhance the manufacturing stability.

As described above, there is described the embodiment of the present invention, however, these are illustrations of the present invention, so it is also possible to adopt various structures other than the above descriptions.

For instance, in the above-described embodiment, the barrier metal film is taken to as the tantalum containing barrier metal film, however, this is not the matter to the effect of limiting about it, accordingly, the barrier metal film may be a film including high melting-point metal such as, for instance, Ti, W, Ta and the like. For instance, Ti, TiN, W, WN, Ta, TaN or the like are exemplified as favorable barrier metal film. Particularly, the tantalum containing barrier metal in which TaN and Ta are formed is preferably used. The barrier metal film is capable of being formed by the technique such as the sputtering method, CVD and the like. Owing to this, it is possible to obtain the barrier metal film with excellent barrier characteristics.

In the embodiment described above, the etching with Ar+ plasma is carried out, however, it is not the matter to the effect of particularly limiting about it, accordingly, the plasma treatment in the present invention is capable of employing nitrogen, argon, or helium or the like as gas. Further, as a plasma treatment under a reducing atmosphere, for instance, it is possible to use an ammonia plasma treatment. By performing the plasma treatment under a reducing atmosphere, it is possible to reduce an oxide of the copper containing metal film surface of the interconnect.

Further, in the embodiment described above, the different metal high concentration region may be formed by a method of carrying out an annealing, after forming the different metal elements containing film and the copper plating film. By carrying out the annealing, it is possible to easily diffuse the different metal elements into the copper containing metal film.

While, after forming the first interconnect 22a, a recess may be formed on a region close to the connection hole 28 within the first interconnect 22a by a technique such as etching. And, on its recess, by a technique such as CVD, it is possible to form the different metal element containing film.

Also, in this case, the concentration of Al to be the different metal element of a region in which this different metal element containing film resides is higher than that of another region of the first interconnect 22a, owing to this, an effect of the stress migration suppression are obtained.

Besides, by the known various physical or chemical methods, it is possible to form the different metal element high concentration region 96a in the interface vicinity between the above described first interconnect 22a and the connection hole 28.

In the embodiment described above, it is possible to form the copper containing metal film of the first interconnect by the plating technique. After forming the copper containing metal film by carrying out the plating technique, it is possible to diffuse different metals from the seed metal film containing different metal such as Al or the like previously provided by the annealing. Owing to this, it is possible to suppress the stress migration of the first interconnect. In this case, the heat treatment is capable of being performed in inert gas atmosphere such as argon or nitrogen or the like.

Further, in the embodiment described above, also the copper containing metal film of the connecting plug or the copper containing metal film of the second interconnect may be formed by the plating technique.

Further, in the embodiment described above, the copper containing metal film may be formed by the CVD such as the sputtering or the plasma CVD. When forming the copper containing metal film by the sputtering or the CVD, a crystallinity of the copper containing metal film becomes favorable, thus it is possible to further suppress the stress migration.

In the embodiment described above, an insulating film composed of an interconnect layer, an interlayer insulating film between a lower layer interconnect and an upper layer interconnect may be one containing poly organo siloxane, aromatic containing organic materials, SiOC, and multilayered film composed of a SiOC film and a $SiO_2$ film, and the like. Thus, it is possible to improve characteristics of the semiconductor device upon forming the interlayer insulating film with low dielectric constant materials.

It is apparent that the present invention is not limited to the above embodiment that modified and changed without departing from the scope and sprit of the invention.

What is claimed is:

1. A method for manufacturing a semiconductor device, comprising:
   forming a first insulating film on a substrate;
   forming an interconnect trench in said first insulating film;
   forming a first copper containing metal film in said interconnect trench;
   forming a second insulating film on said first copper containing metal film;
   forming a connection hole reaching an upper face of said first copper containing metal film from an upper face of said second insulating film, in said second insulating film;
   forming a seed metal film including a copper element and different metal elements so as to come into contact with an upper face of said first copper containing metal film, on an inner portion of said connection hole;
   forming a second copper containing metal film so as to come into contact with an upper face of said seed metal film, on an inner portion of said connection hole; and
   carrying out heat treatment of said first copper containing metal film and said seed metal film, thereby distributing the different metal elements into the first copper containing metal film.

2. The method for manufacturing a semiconductor device according to claim 1, wherein said forming said first copper containing metal film, comprises:
   forming lower layer seed metal film including copper element and different metal elements in said interconnect trench; and
   forming said first copper containing metal film so as to come into contact with an upper face of said lower layer seed metal film, in said interconnect trench, and
   further comprises:
   carrying out heat treatment of said first copper containing metal film and said lower layer seed metal film.

3. The method for manufacturing a semiconductor device according to claim 1, wherein said forming said seed metal film comprises:

forming said seed metal film including not less than one kind of elements selected from a group composed of Sn, Al and Ti as said different metal elements.

4. The method for manufacturing a semiconductor device according to claim 2, wherein said forming said lower layer seed metal film comprises:

forming said lower layer seed metal film including not less than one kind of elements selected from a group composed of Sn, Al and Ti as said different metal elements.

5. A method for manufacturing a semiconductor device, comprising:

forming a first insulating film on a substrate;

forming an interconnect trench in said first insulating film;

forming a first copper containing metal film in said interconnect trench;

forming a second insulating film on said first copper containing metal film;

forming a connection hole reaching an upper face of said first copper containing metal film from an upper face of said second insulating film, in said second insulating film;

forming a barrier metal film in said connection hole;

removing said barrier metal film residing on a bottom of said connection hole in such a way as to expose said first copper containing metal film;

forming a seed metal film including a copper element and different metal elements so as to come into contact with an upper face of said first copper containing metal film, on an inner portion of said connection hole;

forming a second copper containing metal film so as to come into contact with an upper face of said seed metal film, on an inner portion of said connection hole; and carrying out heat treatment of said first copper containing metal film and said seed metal film, thereby distributing the different metal elements into the first copper containing metal film.

6. The method for manufacturing a semiconductor device according to claim 5, wherein said forming a barrier metal film in said connection hole, comprises:

forming the tantalum containing barrier metal film.

* * * * *